(12) United States Patent
Kaneko et al.

(10) Patent No.: US 7,116,854 B2
(45) Date of Patent: Oct. 3, 2006

(54) OPTICAL ELEMENT ARRAY, OPTICAL MODULE, AND OPTICAL TRANSMISSION DEVICE

(75) Inventors: Tsuyoshi Kaneko, Shimosuwa-machi (JP); Hajime Onishi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 35 days.

(21) Appl. No.: 11/045,271

(22) Filed: Jan. 31, 2005

(65) Prior Publication Data

US 2005/0169571 A1   Aug. 4, 2005

(30) Foreign Application Priority Data

Jan. 29, 2004   (JP) .............................. 2004-021384

(51) Int. Cl.
*G02B 6/12*   (2006.01)
(52) U.S. Cl. .............................. 385/14; 385/49; 385/33; 385/131; 372/50
(58) Field of Classification Search .................. 385/14, 385/33, 131; 372/43, 50
See application file for complete search history.

(56) References Cited

U.S. PATENT DOCUMENTS

| | | | |
|---|---|---|---|
| 5,887,013 A * | 3/1999 | Lee et al. ................. | 372/50.21 |
| 6,877,914 B1 * | 4/2005 | Okada et al. .................. | 385/92 |
| 2003/0194193 A1 * | 10/2003 | Masuda ........................ | 385/131 |
| 2004/0218850 A1 * | 11/2004 | Peters .......................... | 385/14 |

FOREIGN PATENT DOCUMENTS

JP      A 10-135568      5/1998

* cited by examiner

*Primary Examiner*—Sung Pak
*Assistant Examiner*—James D. Stein
(74) *Attorney, Agent, or Firm*—Oliff & Berridge, PLC

(57) ABSTRACT

To provide a optical element array in which a plurality of optical elements can be monolithically integrated, and each of the optical elements can be independently driven. A optical element array in accordance with the present invention includes a plurality of optical elements having light emitting sections formed above a substrate and photodetecting sections formed above the light emitting sections; and an element isolation section that is formed between the optical elements, for electrically isolating each of the optical element from the other, wherein the substrate is dielectric or semi-dielectric, the light emitting section includes a first semiconductor layer, an active layer, and a second semiconductor layer, the photodetecting section includes a first contact layer, a photoabsorption layer, and a second contact layer, the optical element has a first electrode that is electrically connected to the first semiconductor layer, and a second electrode that is electrically connected to the second semiconductor layer, the first electrodes are electrically isolated one from the other between the optical elements, and the second electrodes define a common electrode for driving the light emitting section and the photodetecting section.

12 Claims, 20 Drawing Sheets

OPTICAL ELEMENT ARRAY, OPTICAL MODULE, AND OPTICAL TRANSMISSION DEVICE

BACKGROUND

The present invention relates to optical element arrays, optical modules, and optical transmission devices.

A surface-emitting type semiconductor laser has characteristics in which its light output varies depending on ambient temperatures. For this reason, there may be cases where an optical module that uses a surface-emitting type semiconductor laser may be equipped with a photodetecting function that detects a part of laser light emitted from the surface-emitting type semiconductor laser to thereby monitor light output values. For example, a photodetecting element such as a photodiode or the like may be provided on a surface-emitting type semiconductor laser, such that a part of laser light emitted from the surface-emitting type semiconductor laser can be monitored within the same device (for example, seed Patent Document 1).

This element has a common electrode for driving the surface-emitting type semiconductor laser and the photodetecting element. For example, the photodetecting element is operated by applying a constant reverse bias thereto. In other words, a constant bias is applied between the common electrode described above and another electrode of the photodetecting element for driving. For this reason, in order to modulate the surface-emitting type semiconductor laser, a modulation signal would be implied to the other electrode of the surface-emitting type semiconductor laser, not to the common electrode described above.

[Patent Document 1] Japanese Laid-open Patent Application HEI 10-135568.

SUMMARY

It is an object of the present invention to provide a optical element array in which a plurality of optical elements can be monolithically integrated, and each of the optical elements can be independently driven.

Also, it is an object of the present invention to provide an optical module including the optical element array, and an optical transmission device including the optical module.

A optical element array in accordance with the present invention includes:

a plurality of optical elements having a substrate, light emitting sections formed above the substrate and photodetecting sections formed above the light emitting sections; and an element isolation section that is formed between the optical elements, for electrically isolating the optical elements from one another, wherein the substrate is dielectric or semi-dielectric, the light emitting section includes a first semiconductor layer, an active layer, and a second semiconductor layer, the photodetecting section includes a first contact layer, a photoabsorption layer, and a second contact layer, the optical element has a first electrode that is electrically connected to the first semiconductor layer, and a second electrode that is electrically connected to the second semiconductor layer, the first electrodes are electrically isolated one from the other between the optical elements, and the second electrodes define a common electrode for driving the light emitting section and the photodetecting section.

In a optical element array in accordance with the present invention, the case where another specific element (hereafter referred to as "B") is formed above a specific element (hereafter referred to as "A"), includes a case where B is formed directly on A, and a case where B is formed through another element above A. This similarly applies to a method for manufacturing a optical element array in accordance with the present invention.

In the optical element array, each of the photodetecting elements is electrically isolated from others by each of the element isolation sections. In particular, each of the first electrodes in each of the photodetecting elements is electrically isolated from others by the element isolation section. For example, by transmitting different modulation signals to the first electrodes in the respective optical elements, respectively, the optical elements can be operated differently. Accordingly, in the optical element array, although the second electrodes define a common electrode for driving the light emitting sections and the photodetector sections, each of the optical elements can be driven independently.

In the optical element array in accordance with the present invention, the element isolation section can be a groove.

In the optical element array in accordance with the present invention, the groove can be embedded with dielectric resin.

In the optical element array in accordance with the present invention, the element isolation section can be an impurity layer formed by ion injection.

In the optical element array in accordance with the present invention, the optical element can have a third electrode that is electrically connected to the second contact layer.

In the optical element array in accordance with the present invention, the first contact layer concurrently defines an uppermost layer of the second semiconductor layer, and the second electrode can be formed to be in contact with the first contact layer.

In the optical element array in accordance with the present invention, the optical element can have a fourth electrode that is electrically connected to the first contact layer.

In the optical element array in accordance with the present invention, the fourth electrode can be electrically connected to the second electrode.

In the optical element array in accordance with the present invention, the light emitting section can function as a light emitting diode, the first semiconductor layer can be a first conductive type, and the second semiconductor layer can be a second conductive type.

In the optical element array in accordance with the present invention, the light emitting section can function as a surface-emitting type semiconductor laser, the first semiconductor layer can be a first mirror, and the second semiconductor layer can be a second mirror.

In the optical element array in accordance with the present invention, the optical element can have an optical member that functions as a lens above the photodetecting section.

An optical module in accordance with the present invention can include the optical element array described above, and an optical waveguide.

An optical transmission device in accordance with the present invention can include the optical module described above.

DETAILED DESCRIPTION OF EMBODIMENTS

Preferred embodiments of the present invention are described below with reference to the drawings.

1. First Embodiment 1-1. Structure of Optical Element Array

Figure 1:
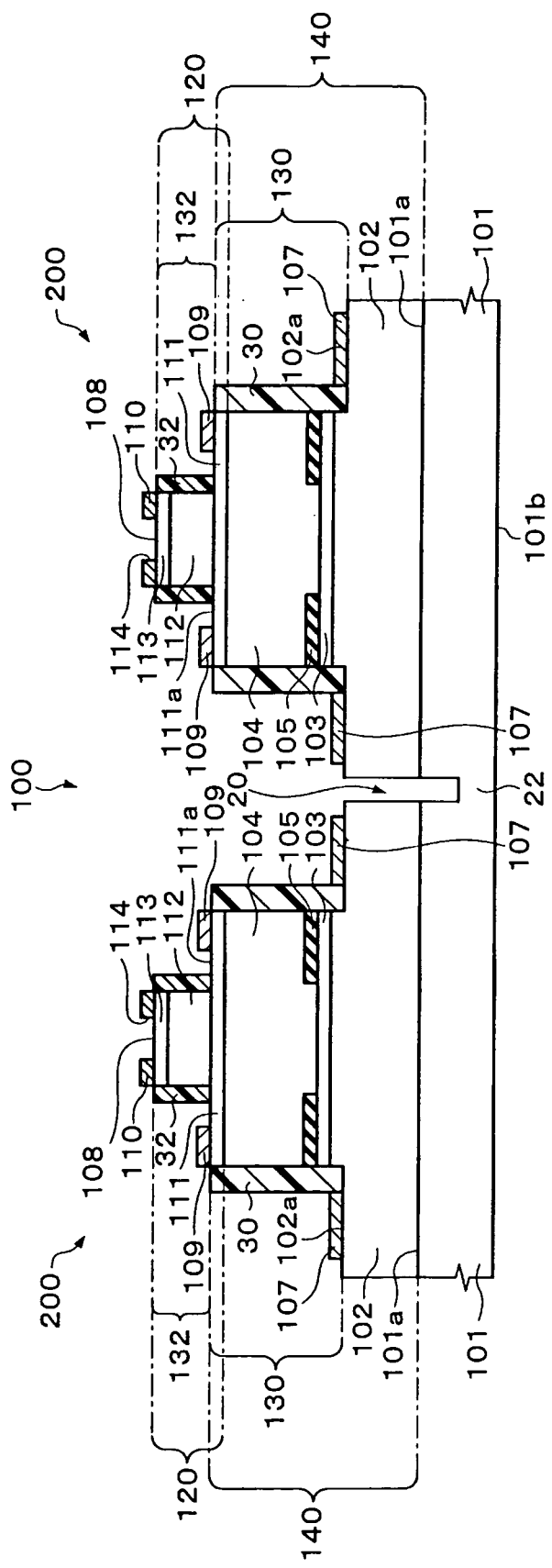
FIG. 1 is a cross-sectional view schematically showing a optical element array in accordance with a first embodiment.
Figure 2:
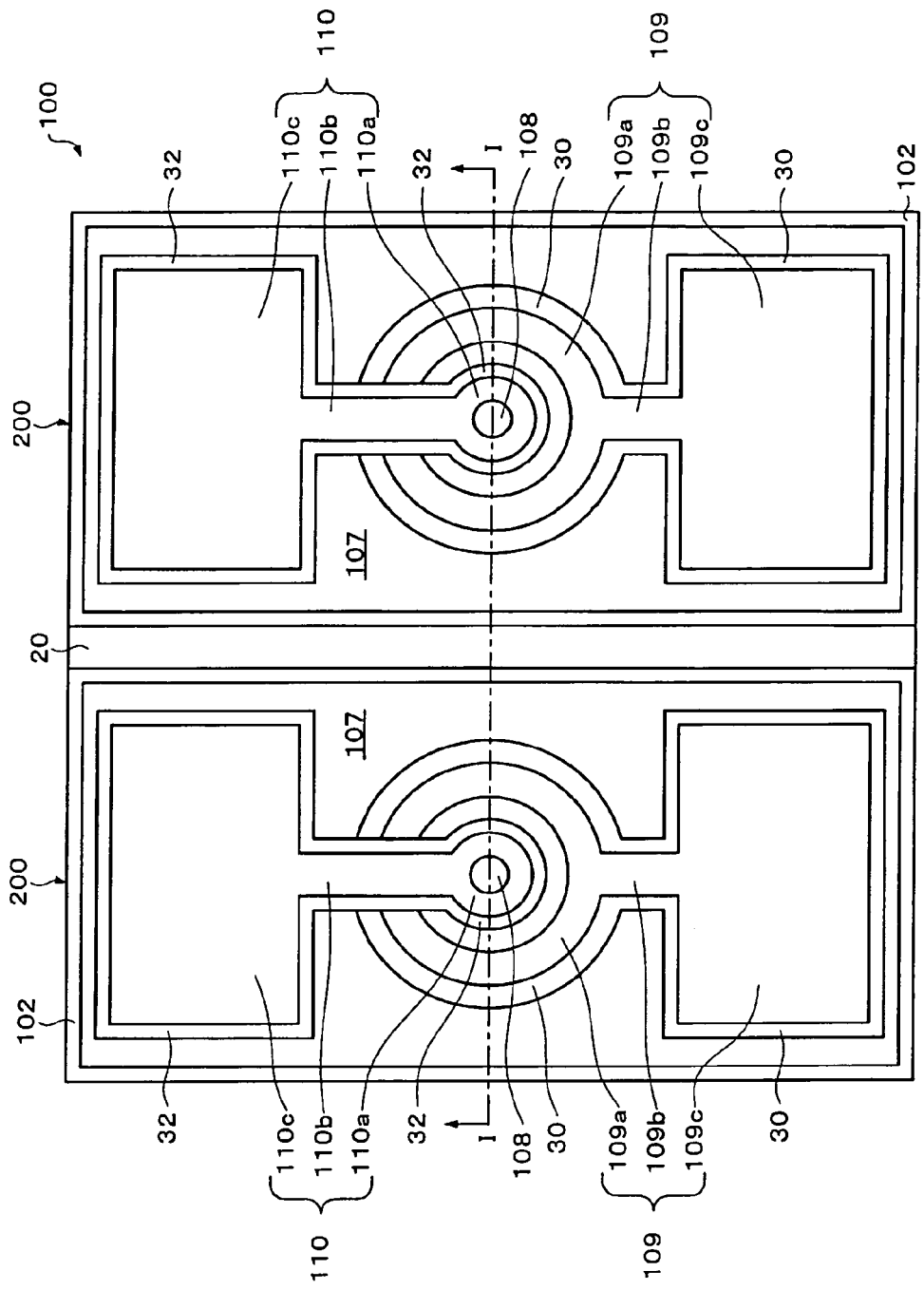
FIG. 2 is a plan view schematically showing the optical element array in accordance with the first embodiment.

FIG. 1 is a cross-sectional view schematically showing a optical element array 100 in accordance with a first embodiment of the present invention. Also, FIG. 2 is a plan view schematically showing the optical element array 100 shown in FIG. 1. It is noted that FIG. 1 is a view showing a cross section taken along a line I—I in FIG. 2.

The optical element array 100 in accordance with the present embodiment includes, as shown in FIG. 1, two optical elements 200, an element isolation section 20. The optical element 200 includes a light emitting section 140, and a photodetecting section 120. The present embodiment shows a case in which the light emitting section 140 functions as a surface-emitting type semiconductor laser, and the photodetecting section 120 functions as a photodetector.

The overall structure of the light emitting section 140, the photodetecting section 120, and the optical element 200, and the element isolation section 20 are described below.

1-2. Light Emitting Section 140

The light emitting section 140 is provided on a semiconductor substrate 101. The light emitting section 140 includes a vertical resonator. Also, the light emitting section 140 can include a columnar semiconductor deposition body (hereafter referred to as a "columnar section") 130.

The substrate 101 is dielectric or semi-dielectric. As a dielectric substrate 101, sapphire, glass or the like can be used. As a semi-dielectric substrate 101, GaAs undoped or with CrO added therein, InP with Fe added therein or the like can be used. In the present embodiment, an example in which a GaAs substrate with CrO added therein is described.

The light emitting section 140 is formed from, for example, a distributed reflection type multilayer mirror of 40 pairs of alternately laminated n-type $Al_{0.9}Ga_{0.1}As$ layers and n-type $Al_{0.15}Ga_{0.85}As$ layers (hereafter called a "first mirror") 102, an active layer 103 composed of GaAs well layers and $Al_{0.3}Ga_{0.7}As$ barrier layers in which the well layers include a quantum well structure composed of three layers, and a distributed reflection type multilayer mirror of 25 pairs of alternately laminated p-type $Al_{0.9}Ga_{0.1}As$ layers and p-type $Al_{0.15}Ga_{0.85}As$ layers (hereafter called a "second mirror") 104, which are successively stacked in layers. It is noted that the composition of each of the layers and the number of the layers forming the first mirror 102, the active layer 103 and the second mirror 104 are not particularly limited to the above.

The second mirror 104 is formed to be p-type by, for example, doping carbon (C), and the first mirror 102 is formed to be n-type by, for example, doping silicon (Si). Accordingly, the p-type second mirror 104, the active layer 103 in which no impurity is doped, and the n-type first mirror 102 form a pin diode. It is noted here that an uppermost layer of the second mirror 104 may preferably be formed to have a high carrier density such that ohmic contact can be readily made with an electrode (second electrode 109). Also, the uppermost layer of the second mirror 104 concurrently defines a first contact layer 111 of the photodetecting section 120 to be described below.

Among the light emitting section 140, a portion extending from the second mirror 104 (first contact layer 111) toward an intermediate portion of the first mirror 102 is etched in a circular shape, thereby forming a first columnar section 130, as viewed from the side of an upper surface 111a of the light emitting section 140 (first contact layer 111). It is noted that, although the plane configuration of the first columnar section 130 in accordance with the present embodiment is formed to be circular, this can be in any configuration.

Furthermore, a current constricting layer 105, that is obtained by oxidizing the AlGaAs layer from its side surface, is formed in a region near the active layer 103 among layers composing the second mirror 104. The current constricting layer 105 is formed in a ring shape. In other words, the current constricting layer 105 has a cross section, when cut in a plane parallel with a surface 101a of the substrate 101 shown in FIG. 1, which is a circular ring shape concentric with a circle of the plane configuration of the columnar section 130.

Also, the light emitting section 140 is provided with a first electrode 107 and a second electrode 109. The first electrode 107 and the second electrode 109 are used to drive the light emitting section 140. Also the second electrode 109 is also used to drive the photodetecting section 120, as described below. In other words, the second electrode 109 serves as a common electrode for driving the light emitting section 140 and the photodetecting section 120.

More specifically, as shown in FIG. 1, the first electrode 107 is provided on an upper surface 102a of the first mirror 102. The first electrode 107, as shown in FIG. 1 and FIG. 2, is provided in a manner to surround mainly the first columnar section 130. Stated otherwise, the first columnar section 130 is provided inside the first electrode 107.

The second electrode 109 is provided on an upper surface 111a of the light emitting section 140 (first contact layer 111). The second electrode 109, as shown in FIG. 2, has a connection section 109a having a plane configuration in a ring shape, a lead-out section 109b having a plane configuration in a linear shape, and a pad section 109c having a plane configuration in a quadrangle shape. The second electrode 109 is electrically connected to the second mirror 104 at the connection section 109a. The lead-out section 109b of the second electrode 109 connects the connection section 109a and the pad section 109c. The pad section 109c of the second electrode 109 can be used as an electrode pad. The connection section 109a of the second electrode 109 is provided in a manner to surround mainly a second columnar section 132 to be described below, as shown in FIG. 1 and FIG. 2. Stated otherwise, the second columnar section 132 is provided inside the second electrode 109.

The first electrode 107 is composed of a laminated film of an alloy of gold (Au) and germanium (Ge), and gold (Au), for example. The second electrode 109 is composed of a laminated film of platinum (Pt), titanium (Ti) and gold (Au), for example. Electric current is injected in the active layer 103 by the first electrode 107 and the second electrode 109. It is noted that the materials for forming the first electrode 107 and the second electrode 109 are not limited to those described above, but, for example, an alloy of gold (Au) and zinc (Zn) can be used.

In the optical element 200 in accordance with the present embodiment, a first insulation layer 30 is formed in a manner to surround mainly the first columnar section 130. The first insulation layer 30 is formed on the first mirror 102. Further, the first insulation layer 30 is formed below the lead-out section 109b and the pad section 109c of the second electrode 109.

It is noted that although a case in which the light emitting section 140 functions as a surface-emitting type semiconductor laser is described above, the present invention is also applicable to other light emitting elements besides the surface-emitting type semiconductor laser. For example, a semiconductor light emitting diode can be enumerated as a light emitting element to which the present invention can be applied. This can be similarly applied to light emitting sections in second through fourth embodiments to be described below.

1-3. Photodetecting Section 120

The photodetecting element 120 is provided on the light emitting section 140. In the optical element 200 of the present embodiment, the upper surface of the photodetecting element 120 includes an emission surface 108 of laser light.

Also, the photodetecting element 120 includes the first contact layer 111, a photoabsorption layer 112, and a second contact layer 113. The first contact layer 111 concurrently defines an upper surface of the second mirror 104 of the light emitting section 140. The photoabsorption layer 112 is provided on the first contact layer 111, and the second contact layer 113 is provided on the photoabsorption layer 112. The photoabsorption layer 112 and the second contact layer 113 compose a columnar semiconductor deposition body (a "second columnar section") 132.

The first contact layer 111 concurrently defines the uppermost layer of the second mirror 104 of the light emitting section 140 described above, and may be composed of, for example, a p-type GaAs layer. Also, the photoabsorption layer 112 may be composed of, for example, a GaAs layer with no impurity being introduced, and the second contact layer 113 may be composed of, for example, an n-type GaAs layer. More specifically, the first contact layer 111 is made to be p-type by doping, for example, carbon (C), and the second contact layer 113 is made to be n-type by doping, for example, silicon (Si). Accordingly, the p-type first contact layer 111, the photoabsorption layer 112 without an impurity being doped, and the n-type second contact layer 113 form a pin diode.

The photodetecting element 120 is provided with a second electrode 109 and a third electrode 110. The second electrode 109 and the third electrode 110 are used to drive the photodetecting element 120. As described above, the second electrode 109 is also used for driving the light emitting section 140. In other words, the second electrode 109 is a common electrode for driving the light emitting section 140 and the photodetecting section 120.

Figure 3:
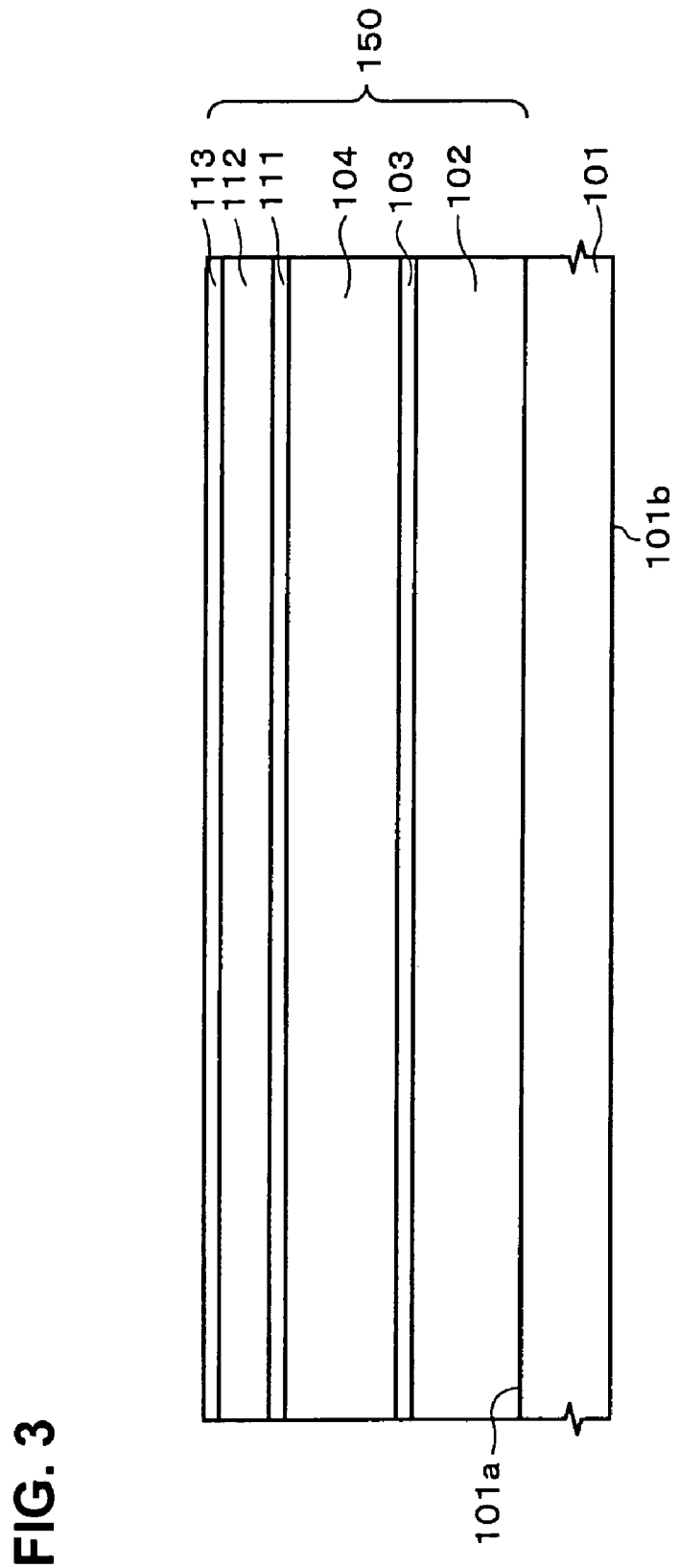
FIG. 3 is a cross-sectional view schematically showing a method for manufacturing the optical element array in accordance with the first embodiment.

As shown in FIG. 3, the third electrode 110 has a connection section having a plane configuration in a ring shape, a lead-out section 110b having a plane configuration in a linear shape, and a pad section 110c having a plane configuration in a quadrangle shape. The third electrode 110 is electrically connected to the second contact layer 113 at the connection section 110a. The lead-out section 110b of the third electrode 110 connects the connection section 110a and the pad section 110c. The pad section 110c of the third electrode 110 can be used as an electrode pad. The third electrode 110 is provided on an upper surface of the photodetecting section 120 (on the second contact layer 113). The third electrode 110 defines an opening section 114, and a part of the upper surface of the second conductive layer 113 is exposed through the opening section 114. The exposed surface defines an emission surface 108 of laser light. Accordingly, by appropriately setting the plane configuration and the size of the opening section 114, the configuration and the size of the emission surface 108 can be appropriately set. In the present embodiment, as shown in FIG. 2, a case in which the emission surface 108 is in a circular shape is indicated.

Also, in the optical element 200 in accordance with the present embodiment, the third electrode 110 can be formed with the same material as that of the first electrode 107.

In the optical element 200 in accordance with the present embodiment, a second insulation layer 32 is formed in a manner to mainly surround the second columnar section 132. The second insulation layer 32 is formed on the second mirror 104, as shown in FIG. 1 and FIG. 2. Further, the second insulation layer 40 is formed below the lead-out section 110b and the pad section 110c of the third electrode 110.

1-4. Overall Structure of Optical Element 200

In the optical element 200 in accordance with the present embodiment, the n-type first mirror 102 and the p-type second mirror 104 of the surface-emitting type semiconductor laser 140, and the p-type first contact layer 111 and the n-type second contact layer 113 of the photodetecting element 120 form a npn structure as a whole.

The photodetecting section 120 has a function to monitor outputs of light generated by the light emitting section 140. More specifically, the photodetecting element 120 converts light generated by the light emitting section 140 into electric current. With values of the electric current, outputs of light generated by the light emitting section 140 can be detected.

More specifically, in the photodetecting element 120, a part of light generated by the light emitting section 140 is absorbed by the photoabsorption layer 112, and photoexcitation is caused by the absorbed light in the photoabsorption layer 112, and electrons and holes are generated. Then, by an electric field that is applied from an outside element, the holes move to the second electrode 109, and the electrons move to the third electrode 110, respectively. As a result, a current is generated in the direction from the second contact layer 113 to the first contact layer 111 in the photodetecting element 120.

Also, light output of the light emitting section 140 is determined mainly by a bias voltage applied to the light emitting section 140. In particular, light output of the light emitting section 140 greatly changes depending on the ambient temperature of the light emitting section 140 and the service life of the light emitting section 140. For this reason, it is necessary for the light emitting section 140 to maintain a predetermined level of light output.

In the optical element 200 in accordance with the present embodiment, light output of the light emitting section 140 is monitored, and the value of a voltage to be applied to the light emitting section 140 is adjusted based on the value of a current generated by the photodetecting element 120, whereby the value of a current flowing within the light emitting section 140 can be adjusted. Accordingly, a predetermined level of light output can be maintained in the light emitting section 140. The control to feed back the light output of the light emitting section 140 to the value of a voltage to be applied to the light emitting section 140 can be performed by using an external electronic circuit (a drive circuit not shown).

1-5. Element Isolation Section 20

In the optical element array 100 in accordance with the present embodiment, the element isolation section 20 is formed between the two optical elements 200. More specifically, as shown in FIG. 1 and FIG. 2, the element isolation section 20 is a groove that is formed in the first mirror 102 and the substrate 101. As shown in FIG. 2, the element isolation section 20 has a plane configuration in a linear shape.

The two optical elements 200 are electrically isolated from each other by the element isolation section 20. More specifically, the element isolation section 20 penetrates the first mirror 102. Then the two optical elements 200 are connected to each other by the connection section 22 of the substrate 101. As described above, the substrate 101 is dielectric or semi-dielectric. In other words, current does not flow, or is difficult to flow in the substrate 101. Naturally, current does not flow, or is difficult to flow in the connection section 22 of the substrate 101. Accordingly, current does not flow, or is difficult to flow in the connection section 22 that connects the two optical elements 200, such that the two optical elements 200 can be electrically isolated from one another.

1-6. Operation of Optical Element 200

General operations of the optical element 200 of the present embodiment are described below. It is noted that the following method for driving the optical element 200 is described as an example, and various changes can be made without departing from the subject matter of the present invention.

First, when a voltage in a forward direction is applied to the pin diode across the first electrode 107 and the second electrode 109, recombination of electrons and holes occur in the active layer 103 of the light emitting section 140, thereby causing emission of light due to the recombination. Stimulated emission occurs during the period the generated light reciprocates between the second mirror 104 and the first mirror 102, whereby the light intensity is amplified. When the optical gain exceeds the optical loss, laser oscillation occurs, whereby laser light is emitted from the upper surface 104a of the second mirror 104. Then, the laser light enters the first contact layer 111 of the light emitting section 120.

Next, the laser light that has entered the first contact layer 111 of the photodetector element 120, enters the photoabsorption layer 112. As a result of a part of the incident light being absorbed by the photoabsorption layer 112, photoexcitation is caused in the photoabsorption layer 112, and electrons and holes are generated. Then, by an electric field that is applied from an outside element, the holes move to the second electrode 109 and the electrons move to the third electrode 110, respectively. As a result, an electric current (photoelectric current) is generated in the direction from the second contact layer 113 to the first contact layer 111 in the photodetecting element 120. By measuring the value of the electric current, light output of the light emitting section 140 can be detected.

1-7. Method for Manufacturing Optical Element Array 100

Next, one example of a method for manufacturing the optical element array 100 in accordance with an embodiment of the present invention is described, using FIG. 3–FIG. 9. FIG. 3–FIG. 9 are cross-sectional views schematically showing a process of manufacturing optical element array 100 shown in FIG. 1 and FIG. 2, and correspond to the cross-sectional view shown in FIG. 1, respectively.

(1) First, on a surface 101a of a semiconductor substrate 101 composed of an i-type GaAs layer, a semiconductor multilayer film 150 shown in FIG. 3 is formed by epitaxial growth while modifying its composition. It is noted here that the semiconductor multilayer film 150 is formed from, for example, a first mirror 102 of 40 pairs of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, a second mirror 104 of 25 pairs of alternately laminated p-type $Al_{0.9}Ga_{0.1}As$ layers and p-type $Al_{0.15}Ga_{0.85}As$ layers, a first contact layer 111 composed of a p-type GaAs layer, and concurrently defines an uppermost layer of the second mirror 104, a photoabsorption layer 112 composed of a GaAs layer without impurity being doped, and a second contact layer composed of an n-type GaAs layer. These layers are successively stacked in layers on the semiconductor substrate 101, thereby forming the semiconductor multilayer film 150.

It is noted that, when the second mirror 104 is grown, at least one layer thereof near the active layer 103 can be formed to be a AlAs layer or a AlGaAs layer that is later oxidized and becomes an insulation layer for current constriction 105. The Al composition of the AlGaAs layer that becomes to be the insulation layer 105 is, for example, 0.95 or greater. Also, the first contact layer 111 and the second contact layer 113 may preferably be formed to have a high carrier density, such that ohmic contact can be readily made with an electrode (second electrode 109 and third electrode 110).

The temperature at which the epitaxial growth is conducted is appropriately decided depending on the growth method, the kind of raw material, the type of the semiconductor substrate 101, and the kind, thickness and carrier density of the semiconductor multilayer film 150 to be formed, and in general may preferably be 450° C.–800° C. Also, the time required for conducting the epitaxial growth is appropriately decided like the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 4:
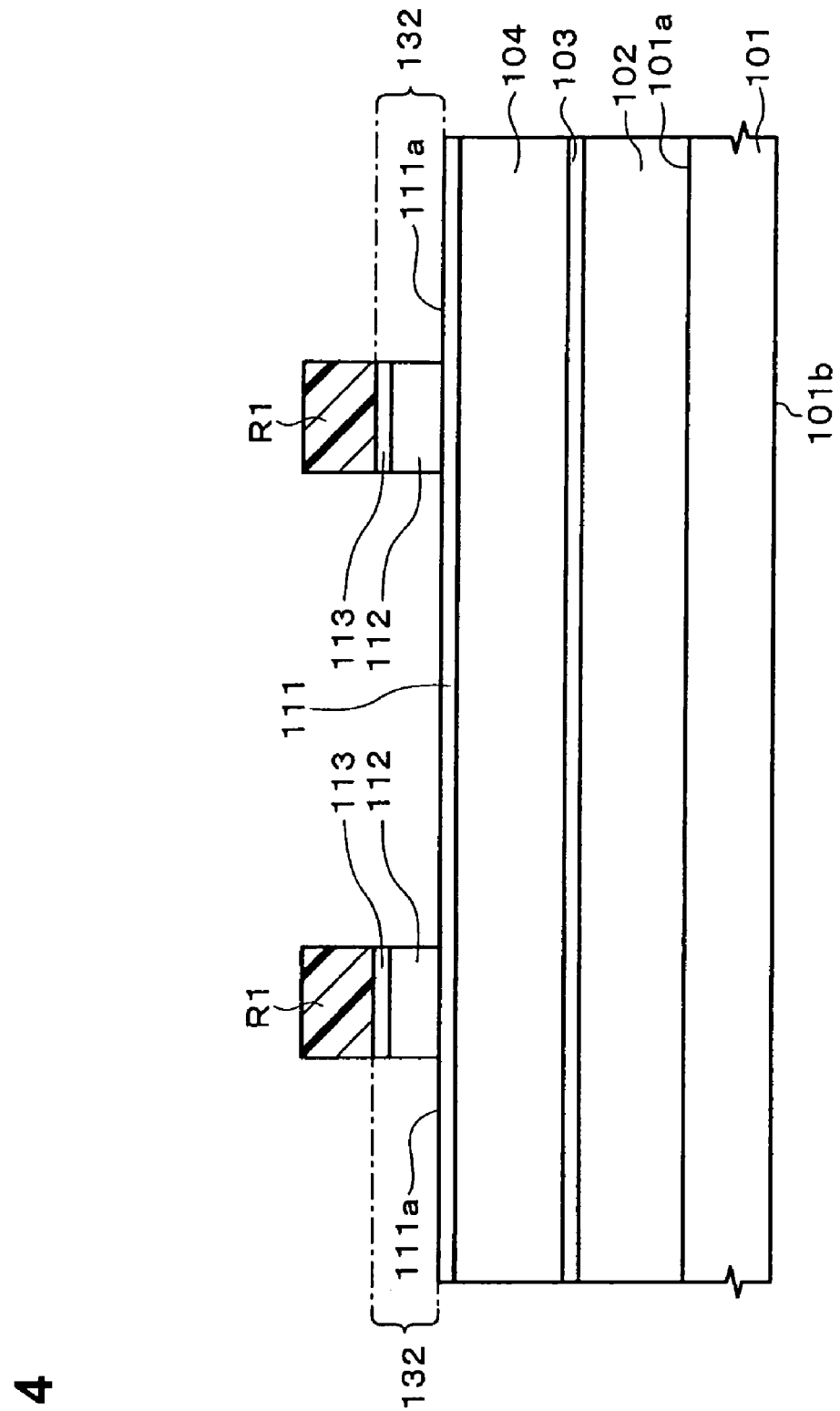
FIG. 4 is a cross-sectional view schematically showing the method for manufacturing the optical element array in accordance with the first embodiment.

(2) Next, a second columnar section 132 is formed (see FIG. 4). First, resist (not shown) is coated on the semiconductor multilayer film 150, and then the resist is patterned by a lithography method, thereby forming a resist layer R1 having a specified pattern.

Then, by using the resist layer R1 as a mask, the second contact layer 113 and the photoabsorption layer 112 are etched by, for example, a dry etching method. By this, the second contact layer 113 and the photoabsorption layer 112 having the same plane configuration as that of the resist layer R1 are formed. In other words, the second columnar section 132 is formed. Then, the resist layer R1 is removed.

Figure 5:
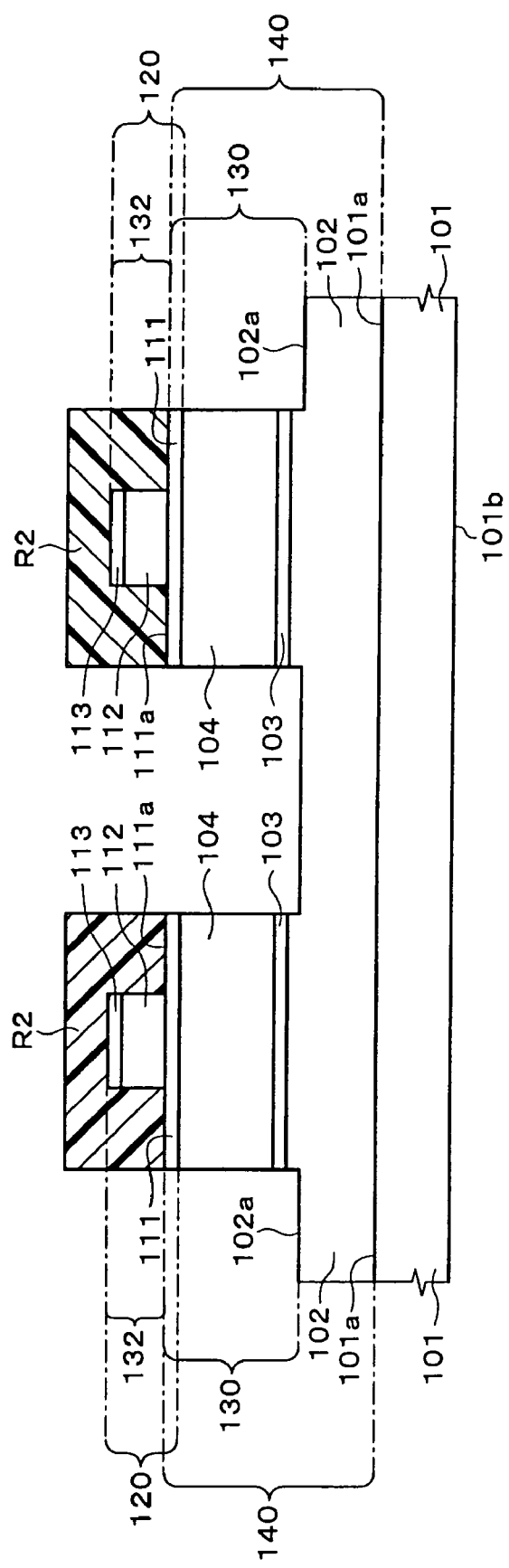
FIG. 5 is a cross-sectional view schematically showing the method for manufacturing the optical element array in accordance with the first embodiment.

(3) Then, a light emitting section 140 including a first columnar section 130 is formed by patterning (see FIG. 5). More specifically, first, resist (not shown) is coated on the first contact layer 111, and then the resist is patterned by a lithography method, thereby forming a resist layer R2 having a specified pattern. Then, by using the resist layer R2 as a mask, the first contact layer 111, the second mirror 104, the active layer 103, and a part of the first mirror 102 are etched by, for example, a dry etching method. By this, as shown in FIG. 5, the first columnar section 130 is formed.

By the steps described above, a vertical resonator (light emitting section 140) including the first columnar section 130 is formed on the substrate 101. In other words, a stacked layered body of the light emitting section 140 and the photodetecting section 120 is formed. Then, the resist layer R2 is removed.

It is noted that, in the present embodiment described above, the description is made as to a case in which the second columnar section 132 is formed first, and then the first columnar section 130 is formed. However, the first columnar section 130 may be formed first, and then the second columnar section 132 may be formed.

Figure 6:
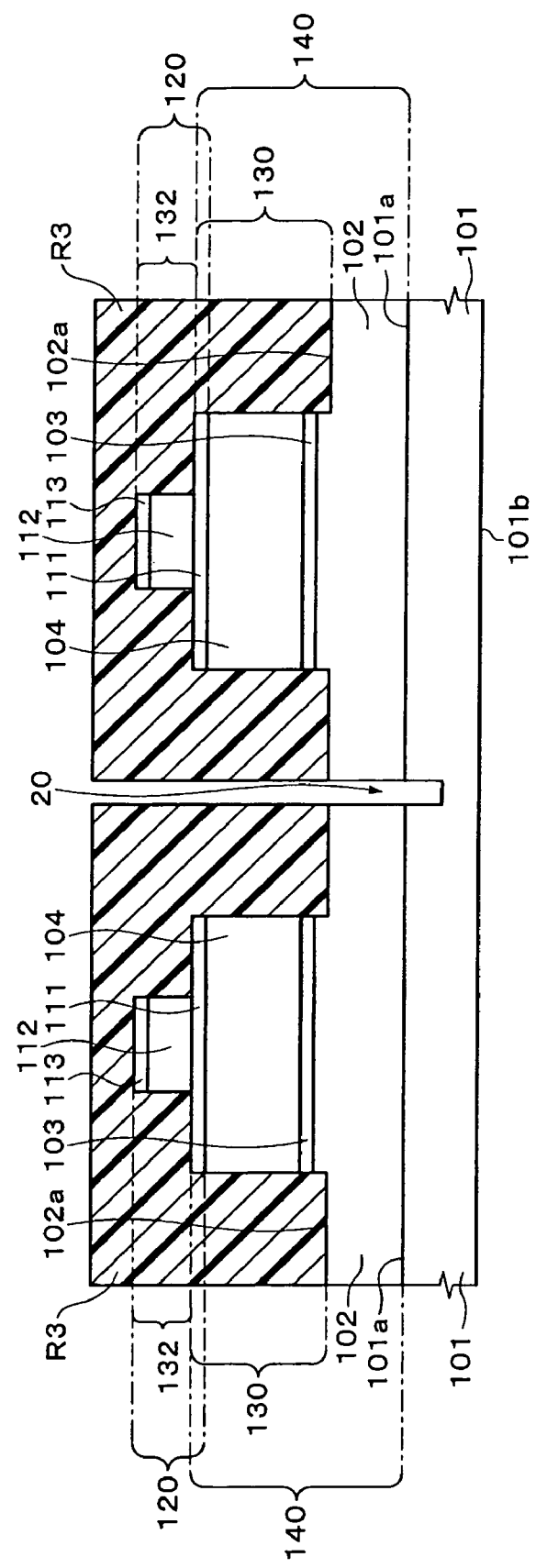
FIG. 6 is a cross-sectional view schematically showing the method for manufacturing the optical element array in accordance with the first embodiment.

(4) Then, an element isolation section 20 is formed by patterning (see FIG. 6). More specifically, first, resist (not shown) is coated on an upper surface 102a of the first mirror 102, the resist is patterned by a lithography method, thereby forming a resist layer R3 having a specified pattern. Then, by using the resist layer R3 as a mask, the first mirror 102 and a part of the substrate 101 are etched by, for example, a dry etching method. Thus, a groove is formed in the first mirror 102 and a part of the substrate 101. This groove is formed in a manner to penetrate the first mirror 102. This groove is formed in a manner not to penetrate the substrate 101. The width of the groove is appropriately set depending on the layout of the two optical elements 200. By this, the element isolation section 20 is formed, as shown in FIG. 6. Then, the resist layer R3 is removed.

It is noted that, in the present embodiment described above, the description is made as to a case in which the element isolation section 20 is formed after the second columnar section 132 and the first columnar section 130 are formed first. However, the order of the step of forming the element isolation section 20 and other steps is not particularly limited. For example, it is also possible that the second columnar section 132 and the first columnar section 130 can be formed after the element isolation section 20 has been formed.

Figure 7:
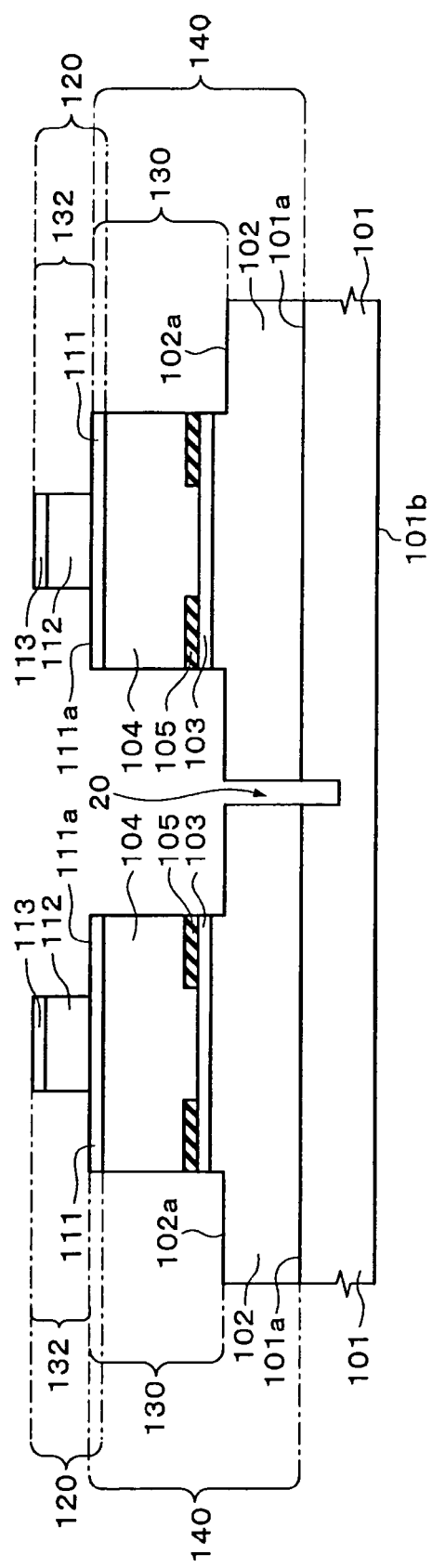
FIG. 7 is a cross-sectional view schematically showing the method for manufacturing the optical element array in accordance with the first embodiment.

Then, by placing the semiconductor substrate 101 on which the first columnar section 130 is formed through the aforementioned steps in a water vapor atmosphere at about 400° C., for example, a layer having a high Al composition provided in the second mirror 104 is oxidized from its side surface, thereby forming a current constricting layer 105 (see FIG. 7).

The oxidation rate depends on the temperature of the furnace, the amount of water vapor supply, and the Al composition and the film thickness of the layer to be oxidized. In a surface-emitting type laser equipped with a current constricting layer that is formed by oxidation, when it is driven, a current flows only in a portion where the current constricting layer is not formed (a portion that is not oxidized). Accordingly, in the process for forming the current constricting layer by oxidation, the range of the current constricting layer 105 to be formed may be controlled, whereby the current density can be controlled.

Also, the diameter of the current constricting layer 105 may preferably be adjusted such that a major portion of light that is emitted from the light emitting section 140 enters the first contact layer 111.

Figure 8:
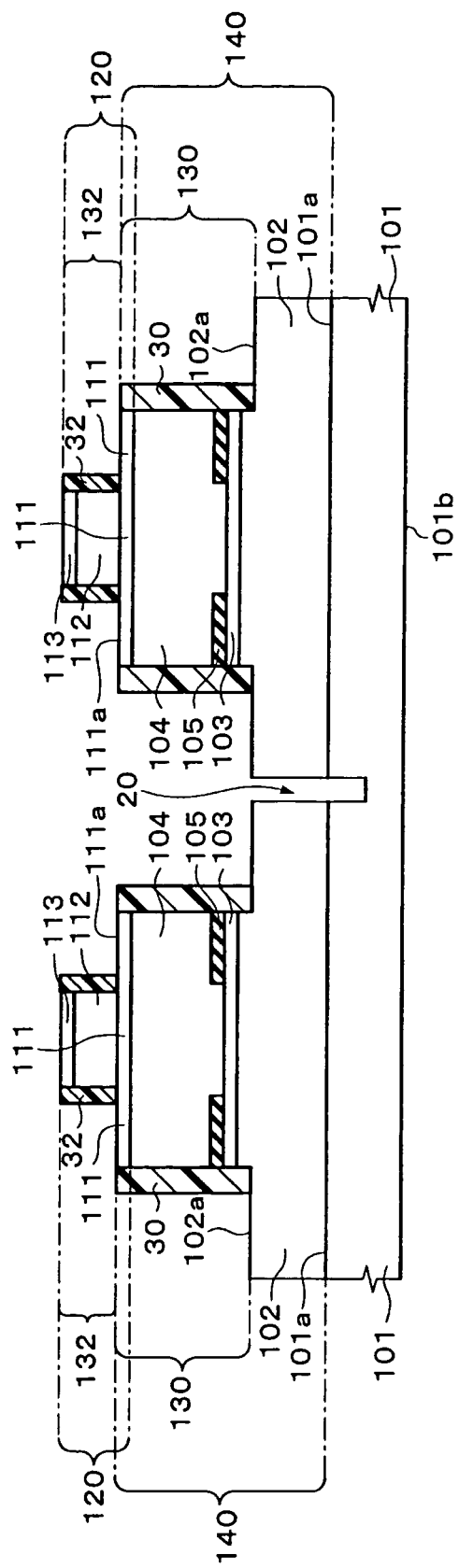
FIG. 8 is a cross-sectional view schematically showing the method for manufacturing the optical element array in accordance with the first embodiment.

(6) Next, as shown in FIG. 8, a first insulation layer 30 is formed on the first mirror 102, and around the first columnar section 130, and a second insulation layer 32 is formed on the second mirror, and around the second columnar section 312.

For example, the first insulation layer 30 and the second insulation layer 32 can use layers that may be obtained by hardening liquid material settable by energy, such as, heat, light or the like (for example, a precursor of ultraviolet setting type resin or thermosetting type resin). As the ultraviolet setting type resin, for example, an acrylic resin, an epoxy resin or the like that is an ultraviolet setting type can be enumerated. Also, as the thermosetting type resin, a polyimide resin or the like that is a thermosetting type can be enumerated. Also, the first insulation layer 30 and the second insulation layer 32 can use an inorganic dielectric film, such as, for example, a silicon oxide film, silicon nitride film or the like. Also, the first insulation layer 30 and the second insulation layer 32 can be made to be a laminated film using a plurality of the materials described above.

Here, the case where a precursor of polyimide resin is used as the material for forming the first insulation layer 30 and the second insulation layer 32 is described. First, for example, by using a spin coat method, the precursor (precursor of polyimide resin) is coated on the semiconductor substrate 101, thereby forming a precursor layer. It is noted that, as the method for forming the precursor layer, besides the aforementioned spin coat method, another known technique, such as, a dipping method, a spray coat method, a droplet ejection method or the like can be used.

Then, the semiconductor substrate 101 is heated by using, for example, a hot plate or the like, thereby removing the solvent, and then is placed in a furnace at, for example, about 350° C. to thereby imidize the precursor layer, thereby forming a polyimide resin layer that is almost completely set. Then, as shown in FIG. 8, the polyimide resin layer is patterned by using a known lithography technique, thereby forming the first insulation layer 30 and the second insulation layer 32. As the etching method used for patterning, a dry etching method or the like can be used. Dry etching can be conducted with, for example, oxygen or argon plasma.

In the method for forming the first insulation layer 30 and the second insulation layer 32 described above, an example is presented in which a precursor layer of polyimide resin is set, and then patterning is conducted. However, patterning may be conducted before the precursor layer of polyimide resin is set. As the etching method used for this patterning, a wet etching method or the like can be used. The wet etching can be conducted with, for example, an alkaline solution or an organic solution.

Figure 9:
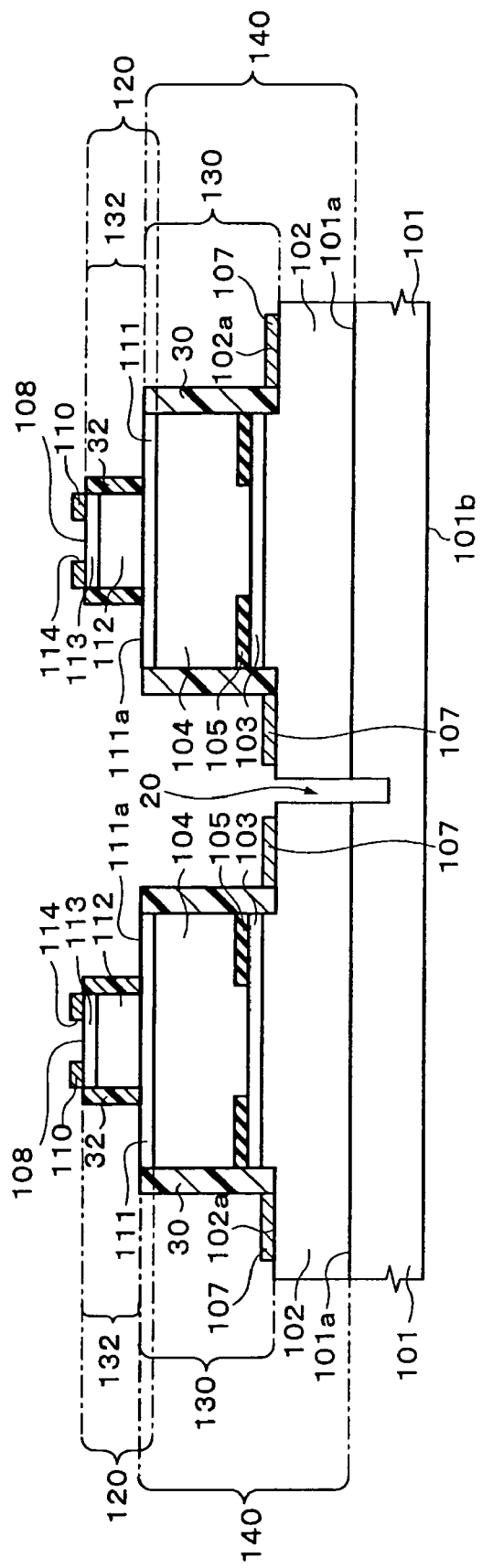
FIG. 9 is a cross-sectional view schematically showing the method for manufacturing the optical element array in accordance with the first embodiment.

(7) Then, a first electrode 107 is formed on an upper surface 102a of the first mirror 102, and a third electrode 110 is formed on an upper surface (upper surface 113a of the second contact layer 113) of the photodetecting section 120 (see FIG. 9).

First, before the first electrode 107 and the third electrode 110 are formed, the upper surface 102a of the first mirror 102 and the upper surface 113a of the second contact layer 113 may be washed by using a plasma processing method or the like, if needed. By so doing, an element with more stable characteristics can be formed.

Next, a laminated film (not shown) of an alloy of gold (Au) and germanium (Ge), and gold (Au), for example, is formed by, for example, a vacuum deposition method. Then, the first electrode 107 and the third electrode 110 are formed by removing the laminated film other than specified positions by a lift-off method. In this instance, a portion where the above-mentioned laminated film is not formed is formed on the upper surface 113a of the second contact layer 113. This portion becomes an opening section 114, and a portion of the upper surface 113a of the second contact layer 113 is exposed through the opening section 114. The exposed surface defines an emission surface 108 of laser light.

It is noted that, instead of the lift-off method, a dry etching method or a wet etching method can also be used. Also, in the aforementioned step, a sputter method can be used, instead of the vacuum vapor deposition method. Also, in the aforementioned step, the first electrode 107 and the third electrode 110 are patterned at the same time, but the first electrode 107 and the third electrode 110 may be formed independently.

(8) Next, by a similar method, a laminated film of platinum (Pt), titanium (Ti), and gold (Au), for example, is patterned, whereby a second electrode 109 is formed on the second mirror 104 of the light emitting section 140 (see FIG. 1 and FIG. 2).

(9) Next, an annealing treatment is conducted. The temperature of the annealing treatment depends on the electrode material. This is usually conducted at about 400° C. for the electrode material used in the present embodiment. Through the steps described above, the first-third electrodes 107, 109 and 110 are formed.

By the steps described above, the optical element array 100 in accordance with the present embodiment shown in FIG. 1 and FIG. 2 can be obtained.

1-8. Actions and Effects

In the optical element array 100, the two optical elements 200 are electrically isolated from each other by the element isolation section 20. In particular, each of the first electrodes 109 in each of the optical elements 200 is electrically isolated from the other by the element isolation section 20. For example, by transmitting different modulation signals to the first electrodes 109 in the respective optical elements 200, respectively, the two optical elements 200 can be operated differently. Accordingly, in the optical element array 100 in accordance with the present embodiment, although the second electrode 109 defines a common electrode for driving the light emitting section 140 and the photodetecting section 120, the two optical elements 200 can be driven independently.

According to the optical element array 100 in accordance with the present embodiment, because a portion of light output of the light emitting section 140 is monitored by the photodetecting section 120 and fed back to the driving circuit, output fluctuations due to temperatures or the like can be corrected, and therefore stable light outputs can be obtained.

1-9. Modified Examples

Figure 10:
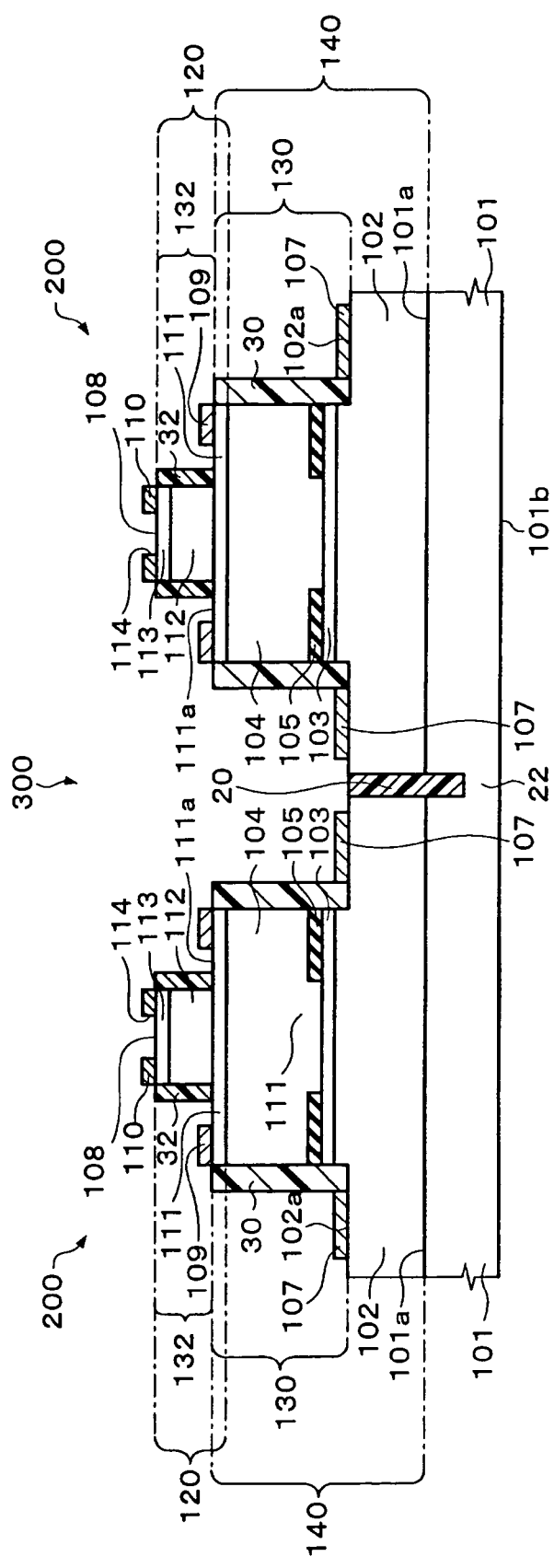
FIG. 10 is a cross-sectional view schematically showing the method for manufacturing the optical element array in accordance with the first embodiment.

In the optical element array 100 shown in FIG. 1 and FIG. 2, the description is made as to the case in which the element isolation section 20 is a groove. However, as shown in FIG. 10, the groove described above can be embedded with insulating resin. By this, the mechanical strength can be improved, compared to the case where the element isolation section 20 is a groove. In other words, when the element isolation section 20 is a groove, the substrate 101 would likely be cleaved along the groove, but it would become difficult to be cleaved because the groove is embedded with resin. As the insulating resin, for example, the same material as that of the first insulation layer 30 or the second insulation layer 32 can be used. It is noted that FIG. 10 is a cross-sectional view schematically showing a optical element array 300 in this case, and corresponds to the cross-sectional view of FIG. 1.

In the optical element array 100 shown in FIG. 1 and FIG. 2, the description is made as to the case in which the element isolation section 20 is a groove. However, as shown in FIG. 1, the groove described above can be an impurity layer that is formed by ion injection. The element isolation section 20 in this case is formed in a forming region of the element isolation section 20 of the first mirror 102 and the substrate 101 by injecting ions by using a known ion injection technique. The element isolation section 20 in this case can be formed over the entire region other than the forming region of the two optical elements 200, as viewed in a plan view. As the ions to be injected, for example, $H^+$, $B^+$, $O^+$ or $Cr^+$ ions can be used. By injecting these ions, the first mirror 102 and the substrate 101 can be formed to have a high resistance. In other words, the element isolation section 20 that electrically isolates the two optical elements 200 from each other can be formed.

Figure 11:
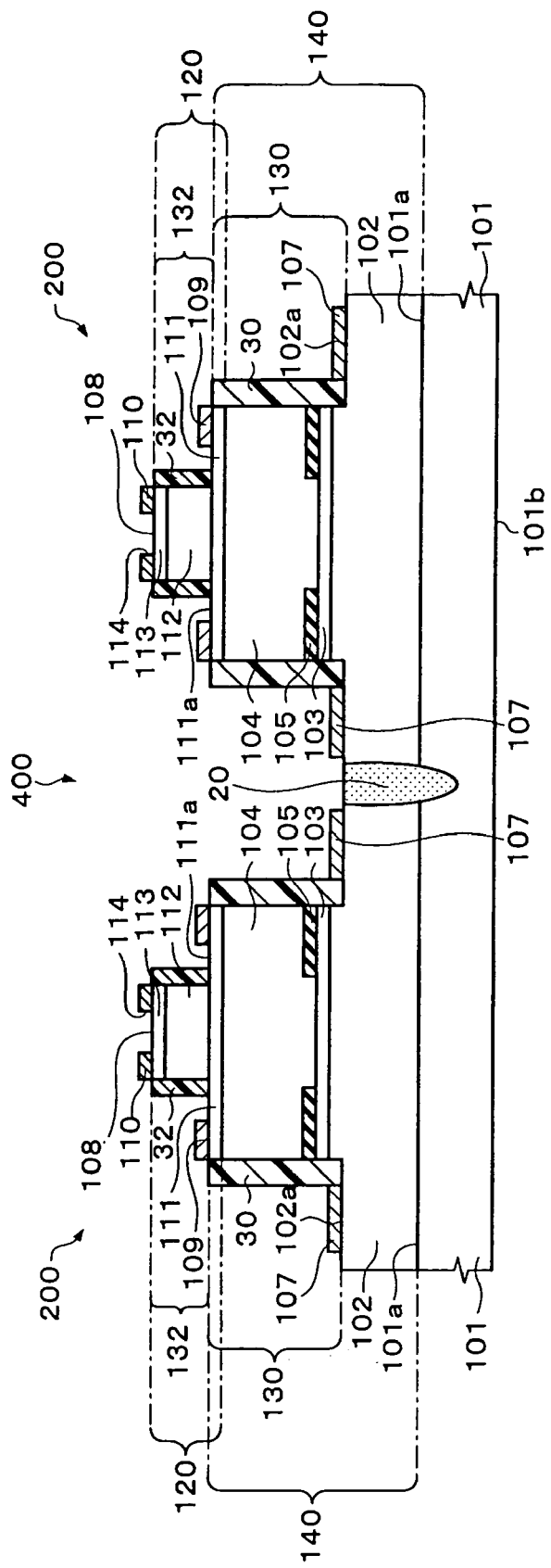
FIG. 11 is a cross-sectional view schematically showing the method for manufacturing the optical element array in accordance with the first embodiment.

By a optical element array 400 shown in FIG. 11, the mechanical strength can be improved, compared to the case where the element isolation section 20 is a groove. In other words, when the element isolation section 20 is a groove, the substrate 101 would likely be cleaved along the groove, but it would become difficult to be cleaved because the element isolation section 20 is an impurity layer. It is noted that FIG. 11 is a cross-sectional view schematically showing the optical element array 400 in this case, and corresponds to the cross-sectional view of FIG. 1.

Figure 12:
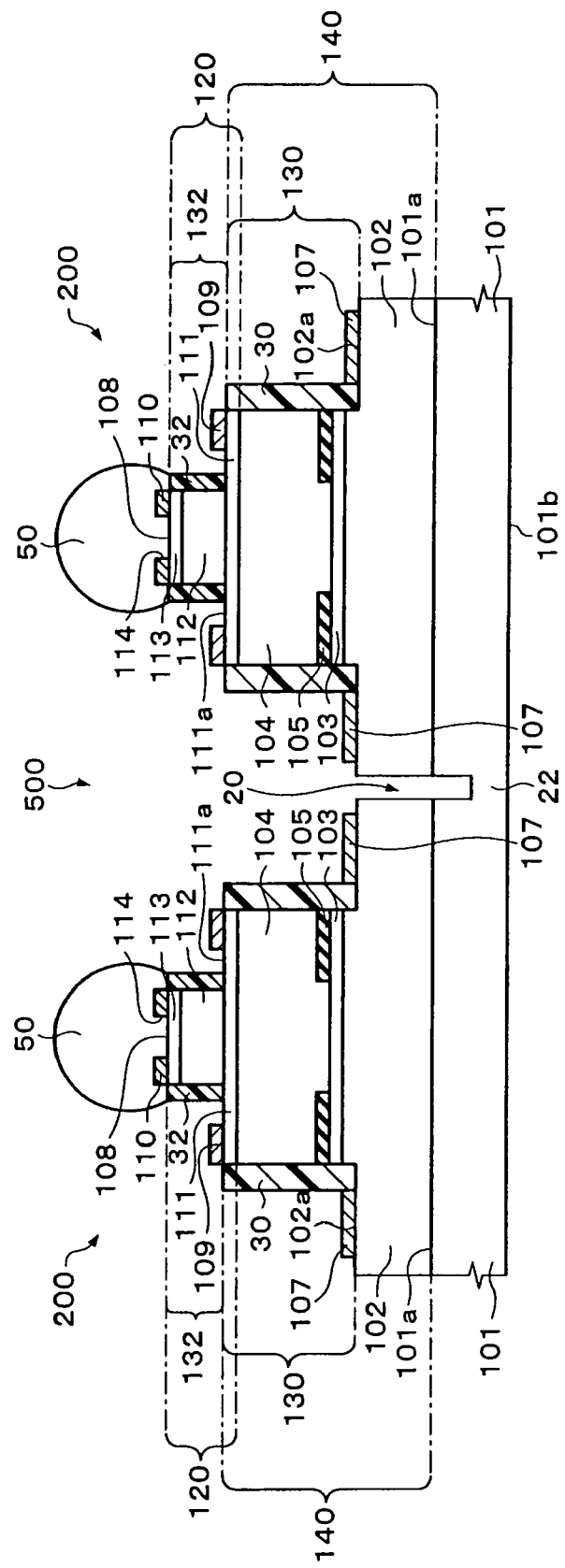
FIG. 12 is a cross-sectional view schematically showing the method for manufacturing the optical element array in accordance with the first embodiment.

Also, as shown in FIG. 12, for example, optical members 50 may be formed on upper surfaces of the photodetecting sections 120. The optical member 50 functions as, for example, a lens. In this case, light generated by the light emitting section 140 can be emitted from the emission surface 108, and then condensed by the optical member 50, and irradiated outside. It is noted that FIG. 12 is a cross-sectional view schematically showing a optical element array 500 in this case, and corresponds to the cross-sectional view of FIG. 1.

The optical member 50 can be formed, for example, by hardening liquid material settable by energy, such as, heat, light or the like (for example, a precursor of ultraviolet setting type resin or thermosetting type resin). As the ultraviolet setting type resin, for example, an acrylic resin, an epoxy resin or the like that is an ultraviolet setting type can be enumerated. Also, as the thermosetting type resin, a polyimide resin or the like that is a thermosetting type can be enumerated.

As the method for forming the optical member 50, more specifically, droplets composed of liquid material are ejected against an upper surface of the photodetecting section 120 by a droplet ejection method or the like, thereby forming an optical member precursor. Then, the optical member precursor is set, thereby obtaining the optical member 50.

Also, the optical member 50 is in a cut-circular globe shape. Because the optical member 50 is in a cut-circular globe shape, the optical member 50 can be used as a lens or a deflection element. For example, by forming the upper surface of the photodetecting section 120 in a circular shape, the three-dimensional configuration of the optical member 50 can be formed into a cut-circular globe shape. Alternatively, by forming the upper surface of the photodetecting section 120 in an oval shape, the three-dimensional configuration of the optical member 50 can be formed into a cut-elliptical globe shape.

It is noted here that the "cut-circular globe shape" means a configuration obtained by cutting a globe in one plane, and the circular globe includes not only a perfect circular globe, but also a configuration approximate to a circular globe. Also, the "cut-elliptical globe shape" means a configuration obtained by cutting an elliptical globe in one plane, and the elliptical globe not only includes a perfect elliptical globe but also a configuration approximate to an elliptical globe.

Because the optical member 50 is provided on the upper surface of the photodetecting section 120, the radiation angle of light generated by the light emitting section 140 is adjusted, and then the light can be irradiated. For example, because the optical member 50 is provided, the radiation angle of light generated by the light emitting section 140 can be narrowed. By this, when light emitted from the optical element 200 in accordance with the present embodiment is to be introduced in an optical waveguide, such as, for example, an optical fiber or the like, introduction of the light into the optical waveguide becomes easy.

Also, in the optical element 200 shown in FIG. 12, the photodetecting section 120 can absorb light coming from outside, and convert the same to electric current. In this case, light from outside first enters the optical member 50, and then enters the photodetecting section 120 through the light incident surface (emission surface) 108. The light is absorbed by the photoabsorption layer 112, and converted into electric current. Based on the current value obtained here, the amount of light entered from outside can be detected. By the optical element 200 shown in FIG. 12, light in a wide range can be entered into the light incident surface (emission surface) 108 because the optical member 50 is provided on the upper surface of the photodetecting section 120.

2. Second Embodiment

Figure 13:
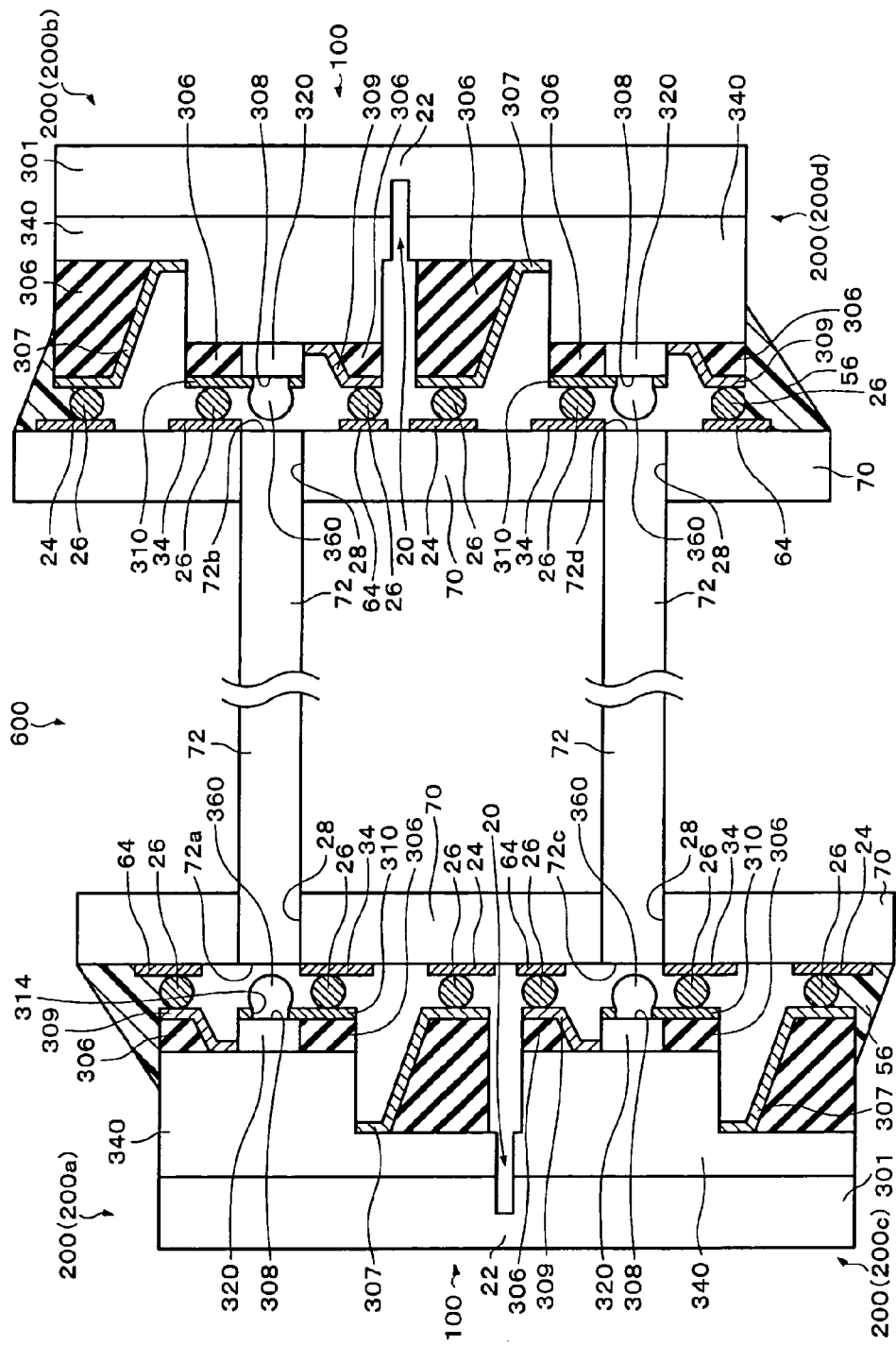
FIG. 13 is a cross-sectional view schematically showing an optical module in accordance with a second embodiment.

FIG. 13 is a view schematically showing an optical module 600 in accordance with a second embodiment of the present invention. The optical module 600 includes two optical element arrays 100 (see FIG. 1 and FIG. 2), semiconductor chips 70, and optical waveguides (optical fibers) 72. The optical module 600 includes four optical elements 200 (a first optical element 200a, a second optical element 200b, a third optical element 200c, and a fourth optical element 200d). In the optical element 200, a photodetecting section 320 has a function to convert light that enters the photodetecting section 320 from a light emitting section 340 into electric current, and has a function to convert light that enters a light incident surface (emission surface) 308 from an optical member 360. Structures and functions common to the first–fourth optical elements 200a, 200b, 200c and 200d are described by generally referring to the "optical element 200."

It is noted that, in the optical module 600 of the present embodiment, the use of any one of the other optical element arrays in accordance with the first embodiment instead of the optical element array 100 can provide similar actions and effects. This similarly applies to third and fourth embodiments to be described below.

2-1. Structure of Optical Module

In the optical module 600, as shown in FIG. 13, the first–fourth optical elements 200a, 200b, 200c and 200d are provided at end surfaces 72a, 72b, 72c and 72d of optical fibers 72, respectively. The first–fourth optical elements 200a, 200b, 200c and 200d have the same structure. Each of the first–fourth optical elements 200a, 200b, 200c and 200d includes a light emitting section 340 and a photodetecting section 320. Each of the layers composing the light emitting section 340 and the photodetecting section 320 has generally the same composition as that of the light emitting section 140 and the photodetecting section 120 of the optical element 200 shown in FIG. 1 and FIG. 2 except the positions of electrodes provided. It is noted that FIG. 13 omits illustration of each of the layers composing the light emitting section 340 and the photodetecting section 320.

In the optical element 200 shown in FIG. 13, a first electrode 307 and a second electrode 309 function to drive the light emitting section 340, and the second electrode 309 and a third electrode 310 function to drive the photodetecting section 320. Also, an opening section 314 is provided in a part of the third electrode 310 in a region positioned above the photodetecting section 320. A bottom surface of the opening section 314 defines an emission surface (incident surface) 308.

Furthermore, an optical member 360 is provided on the emission surface (incident surface) 308. The optical member 360 is composed of a material similar to that of the optical member 50 of the optical element array 500 shown in FIG. 12, and can be formed by a similar method. The first–third electrodes 307, 309 and 310 have portions that are provided on an insulation layer 306. The insulation layer 306 may preferably be composed of a resin, such as, for example, a polyimide resin, fluorine resin, acrylic resin, epoxy resin or the like, or an insulation material, such as, for example, silicon nitride, silicon oxide, oxide nitride silicon or the like.

Each of the first–fourth optical elements 200a, 200b, 200c and 200d functions as a photodetecting element or a light emitting element. The optical module 600 is capable of two-way parallel communications. For example, when the first optical element 200a functions as a light emitting element, and the second optical element 200b functions as a photodetecting element, light generated at the light emitting section 340 of the first optical element 200a is emitted from the emission surface (incident surface) 308, and enters the optical member 360, and then the light is condensed by the optical member 360. Thereafter, the light emitted from the optical member 360 enters the end surface 72a of the optical fiber 72. The incident light propagates within the optical fiber 72, and is emitted from the end surface 72b, enters the incident surface (emission surface) 308 of the second optical element 200b through the optical member 360, and is absorbed by the photodetecting section 320 of the second optical element 200b.

Alternatively, for example, when the first optical element 200a functions as a photodetecting element, and the second optical element 200b functions as a light emitting section, light generated at the light emitting section 340 of the second optical element 200b is emitted from the emission surface (incident surface) 308, and then the light is condensed by the optical member 360. Thereafter, the light emitted from the optical member 360 enters the end surface 72b of the optical fiber 72. The incident light propagates within the optical fiber 72, and is emitted from the end surface 72a, enters the incident surface (emission surface) 308 of the first optical element 200a through the optical member 360, and is absorbed by the photodetecting section 320 of the second optical element 200a.

It is noted that although the functions of the first optical element 200a and the second optical element 200b are described above, the third optical element 200c and the fourth optical element 200d have similar functions.

The first optical element 200a is in a state in which its relative position with respect to the end surface 72a of the optical fiber 72 is fixed, the second optical element 200b is in a state in which its relative position with respect to the end surface 72b of the optical fiber 72 is fixed, the third optical element 200c is in a state in which its relative position with respect to the end surface 72c of the optical fiber 72 is fixed, and the fourth optical element 200d is in a state in which its relative position with respect to the end surface 72d of the optical fiber 72 is fixed. Also, the emission surface (incident surface) 308 of the first optical element 200a is opposite to the end surface 72a of the optical fiber 72, the emission surface (incident surface) 308 of the second optical element 200b is opposite to the end surface 72b of the optical fiber 72, the emission surface (incident surface) 308 of the third optical element 200c is opposite to the end surface 72c of the optical fiber 72, and the emission surface (incident surface) 308 of the fourth optical element 200d is opposite to the end surface 72d of the optical fiber 72.

The semiconductor chips 70 are provided for driving the optical elements 200. In other words, the semiconductor chips 70 have circuits built therein for driving the optical elements 200. A plurality of wiring patterns 24, 34 and 64 that are electrically connected to the internal circuits are provided on the semiconductor chips 70.

The semiconductor chip 70 is electrically connected to the optical element 200. For example, the first electrode 307 and the wiring pattern 24 are electrically connected to each other through solder 26. Also, the second electrode 309 and the wiring pattern 64 are electrically connected to each other through solder 26. Further, the third electrode 310 and the wiring pattern 34 are electrically connected to each other through solder 26.

The optical element 200 can be face-down mounted on the semiconductor chip 70. By so doing, the electrical connection can be made through the solder 26, and the optical element 200 and the semiconductor chip 70 can be affixed together. It is noted that wires or conductive paste may be used for connecting the electrodes and the wiring patterns described above, instead of using the solder 26.

Also, as shown in FIG. 13, the optical element 200 and the semiconductor chip 70 can be affixed together by using resin 56. In other words, the resin 56 has a function to retain the bonding state between the optical element 200 and the semiconductor chip 70. In this case, as shown in FIG. 13, the resin 56 does not cover the optical member 360, such that the difference in the index of refraction between the optical member 360 and its surrounding can be secured. By this, the light condensing function of the optical member 360 can be secured. It is noted that, when the optical member 360 is not provided, the resin 56 can be formed as so-called underfill entirely between the optical element 200 and the semiconductor chip 70.

The semiconductor chip 70 is provided with apertures (for example, through holes) 28. The optical fibers 72 are inserted in the apertures 28. The apertures 28 are formed extending from the surface where the wiring patterns 24, 34 and 64 of the semiconductor chip 70 are formed to the opposite surface, while avoiding the internal circuit. It is noted that a taper (not shown) may preferably be formed at at least one of open edge sections of the aperture 28. By forming the taper, the optical fiber 70 can be readily inserted in the aperture 28.

It is noted that, when a multi-core fiber or the like is used as the optical waveguide, the pitch of the optical elements 200 in the optical element array 100 can be designed to match with the pitch of the fibers. By this, a plurality of the optical elements 200 and the multi-core fiber can be optically connected in a single alignment.

2-2. Optical Module Driving Method

Figure 14:
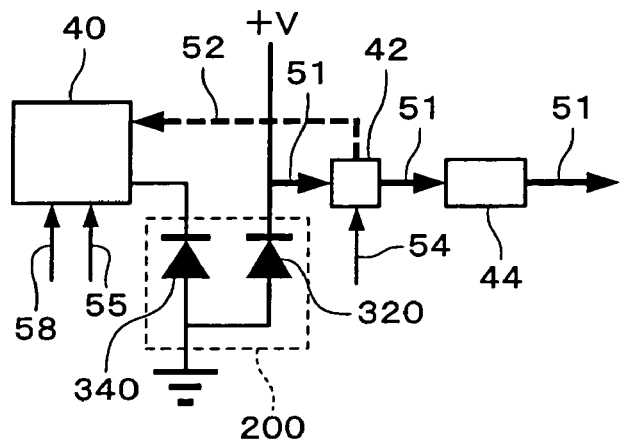
FIG. 14 is a view schematically showing an example of a driving circuit (main part) of the optical element in accordance with the second embodiment.

Next, a method for driving the optical member 600 shown in FIG. 13 is described with reference to FIG. 14. FIG. 14 is a view schematically showing one example of a driving circuit (its main part) of the optical element 200 shown in FIG. 13.

In the optical member 600 shown in FIG. 13, for example, the first optical element 200a and the second optical element 200b may be controlled such that optical transmission and optical reception between them are switched by time division. As described above, when the first optical element 200a functions as a light emitting element, it is controlled such that light generated at the first optical element 200a is received by the second optical element 200b, and when the second optical element 200b functions as a light emitting element, it is controlled such that light generated at the second optical element 200b is received by the first optical element 200a. Also, the time division is controlled by clocks 54 and 55 that are inputted in a driver IC 40 and a switching circuit 42, respectively.

The driving circuit of the optical element 200 includes, as shown in FIG. 14, the driver IC 40, the switching circuit 42, and a trans-impedance amplifier (TIA) 44. The driving circuit shown in FIG. 14 is provided for each of the optical elements 200. Also, in the optical element 200, biases in opposite directions can be applied to the light emitting section 340 and the photodetecting section 320.

The driver IC 40 is electrically connected to one of the electrodes of the light emitting section 340 of the optical element 200, and the switching circuit 42 is electrically connected to one of the electrodes of the photodetecting section 320 of the optical element 200. On the other hand, as shown in FIG. 14, the other electrode of the light emitting section 340 and the other electrode of the photodetecting section 320 are grounded. Furthermore, a reverse bias is applied to one of the electrodes of the photodetecting section 320. The TIA 44 is electrically connected to the switching circuit 42.

The driver IC 40 is provided for driving the light emitting section 340 of the optical element 200. More specifically, while a transmission signal 58 is inputted in the driver IC 40, light generated at the light emitting section 340 is emitted. Also, while the light emitting section 340 is being driven, the photodetecting section 320 can monitor outputs of the light generated at the light emitting section 340. Referring to FIG. 14, operations of the circuit at the time of driving the light emitting section 340 are described more concretely. First, when the transmission signal 58 is inputted in the driver IC 40, the driver IC starts driving the light emitting section 340. Then, while the transmission signal 58 is being inputted in the driver IC 40, the photodetecting section 320 detects a light output generated by the light emitting section 340. The detected light output is inputted by the switching circuit 42 in the driver IC 40 as an APC input 52.

On the other hand, while the transmission signal 58 is not inputted in the driver IC 40, light emitted from the end surface 72a of the optical fiber 72 enters the incident surface (emission surface) 308 of the optical element 200 through the optical member 360. More specifically, while the transmission signal 58 is not inputted in the optical element 200, the switching circuit 42 is switched to the TIA 44 side (see FIG. 14). The TIA 44 has a function to amplify a reception signal 51.

As described above, in the optical member 600 in accordance with the present embodiment, the first and second optical elements 200a and 200b can be controlled by time division such that, when the first optical element 200a is in a light emitting state, the second optical element 200b becomes to be in a photodetecting state, and when the first optical element 200a is in a photodetecting state, the second optical element 200b becomes to be in a light emitting state.

It is noted that, although the control of the first optical element 200a and the second optical element 200b is described above, the third optical element 200c and the fourth optical element 200d can be similarly controlled.

3. Third Embodiment

Figure 15:
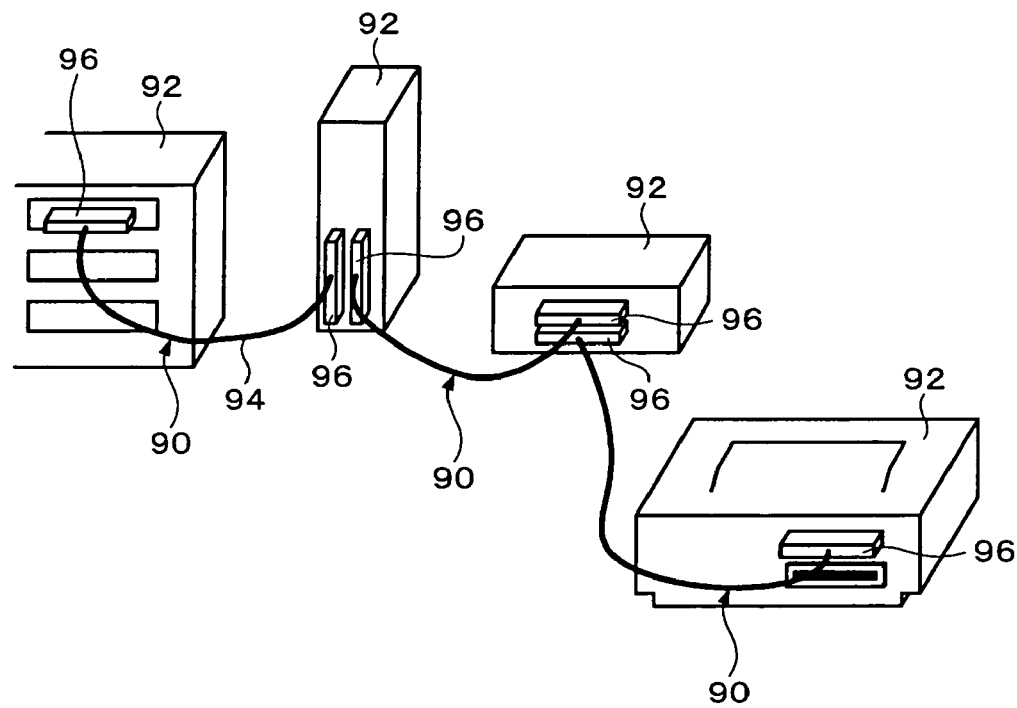
FIG. 15 is a view schematically showing optical transmission devices in accordance with a third embodiment.

FIG. 15 is a view schematically showing optical transmission devices in accordance with a third embodiment of the present invention. The optical transmission devices 90 mutually connect electronic devices 92 such as a computer, display device, storage device, printer and the like. The electronic devices 92 may be data communication devices. The optical transmission device 90 may include a cable 94 and plugs 96 provided on both sides thereof. The cable 94 includes an optical fiber 72 (see FIG. 13). The plug 96 includes on its inside the optical element 200 (200a, 200b, 200c and 200d) and the semiconductor chip 70. It is noted that, because the optical fiber 72 is provided inside the cable 94, and the optical element 200 and the semiconductor chip 70 are provided inside the plug 96, they are not shown in FIG. 15. The optical fiber 72 and the optical element 200 are attached in a manner described in the second embodiment.

The first and second optical elements 200a and 200b are provided at both ends of the optical fiber 72, respectively. When the first optical element 200a that is provided at one of the ends of the optical fiber 72 functions as a photodetecting element, a light signal is converted into an electrical signal by the photodetecting section 320 of the first optical element 200a, and then the electrical signal is inputted in the electronic device 92. In this case, the second optical element 200b that is provided at the other end of the optical fiber 72 functions as a light emitting element. In other words, an electrical signal outputted from the electronic device 92 is converted into an optical signal by the light emitting section 340 of the second optical element 200b. The optical signal is transmitted through the optical fiber 72, and enters the first optical element 200a that functions as a photodetecting element. It is noted that, although the first optical element 200a and the second optical element 200b are described above, the description similarly applies to the third optical element 200c and the fourth optical element 200d.

As described above, by the optical transmission device 90 of the present embodiment, information can be transmitted among the electronic devices 92 by optical signals.

4. Fourth Embodiment

Figure 16:
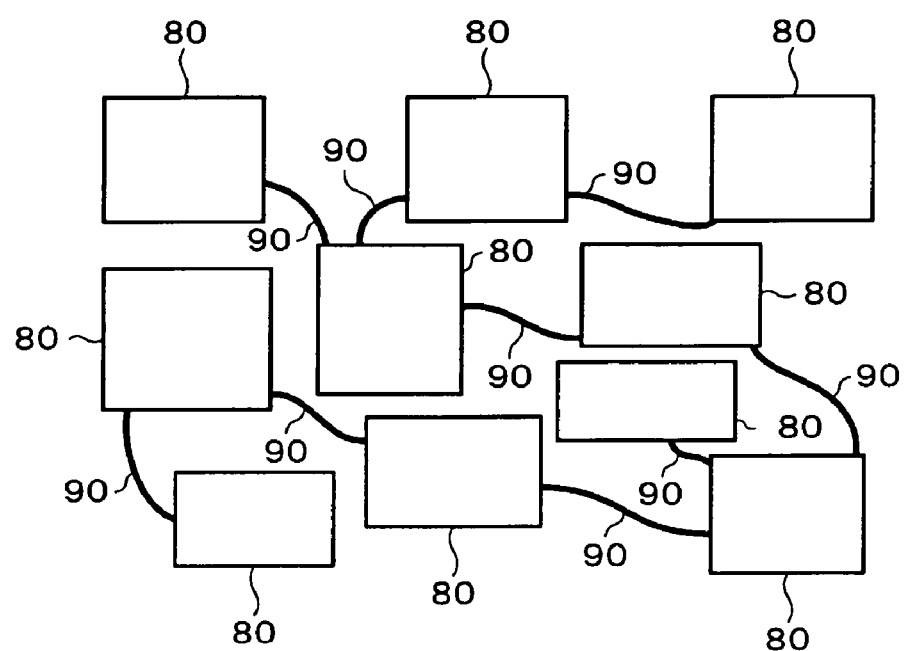
FIG. 16 is a view schematically showing a usage configuration of optical transmission devices in accordance with a fourth embodiment.

FIG. 16 is a view schematically showing a usage configuration of optical transmission devices in accordance with a fourth embodiment of the present invention. Optical transmission devices 90 connect electronic devices 80. The electronic devices 80 include, for example, liquid crystal display monitors, digital CRTs (which may be used in the fields of finance, mail order, medical treatment, and education), liquid crystal projectors, plasma display panels (PDP), digital TVs, cash registers of retail stores (for POS (Point of Sale Scanning), videos, tuners, gaming devices, printers and the like.

Preferred embodiments of the present invention are described above. However, the present invention is not limited to the embodiments described above, and many modifications can be made. For example, interchanging the p-type and n-type characteristics of each of the semiconductor layers in the above described embodiments does not deviate from the subject matter of the present invention. In this case, the p-type first mirror 102 and the n-type second mirror 104 of the light emitting section 140, and the n-type first contact layer 111 and the p-type second contact layer 113 of the photodetecting section 120 can compose a pnp structure as a whole.

Figure 17:
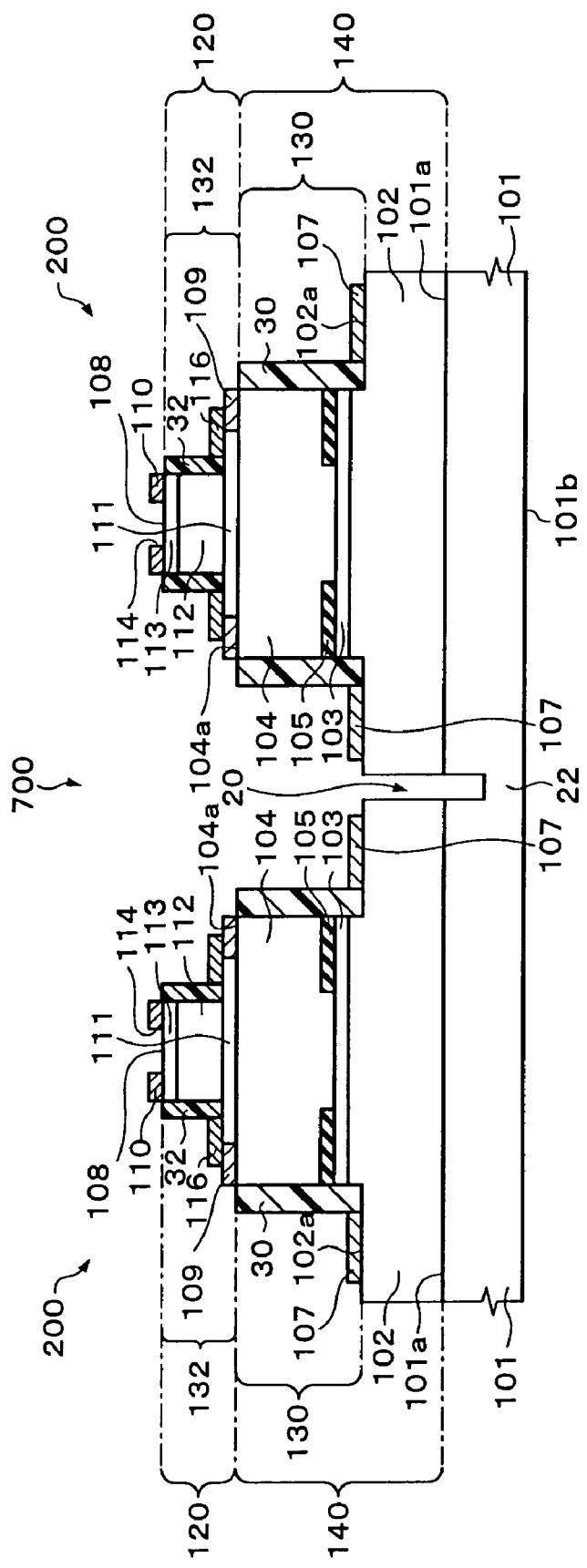
FIG. 17 is a cross-sectional view schematically showing an optical element array in accordance with an embodiment.

Also, as shown in FIG. 17, for example, by interchanging the p-type and n-type characteristics of each of the layers in either the light emitting section 140 or the photodetecting section 120, the light emitting section 140 and the photodetecting section 120 can have a npnp structure or a pnpn structure as a whole. It is noted that FIG. 17 is a cross-sectional view schematically showing a optical element array 700 in this case, and corresponds to the cross-sectional view of FIG. 1.

It is noted in this case that, as shown in FIG. 17, the plane configuration of the first contact layer 111 can be formed to be greater than the plane configuration of the photoabsorption layer 112 and the second contact layer 113, and smaller than the plane configuration of the second mirror 104. Also, a fourth electrode 116 is formed on the first contact layer 111 and the second electrode 109. The first contact layer 111 contacts the second electrode 109 and the fourth electrode 116. The fourth electrode 116 is formed with a portion thereof on the second electrode 109. In other words, the first contact layer 111 contacts the second electrode 109 at its side surface, and contacts the fourth electrode 116 at its upper surface. Also, the fourth electrode 116 is electrically connected to the second electrode 109.

In this case, the third electrode 110 and the fourth electrode 116 are used for driving the photodetecting section 120. For example, the fourth electrode 116 can be formed with the same material as that of the first electrode 107.

In the optical element array 700 shown in FIG. 17, a forward bias to be applied to the light emitting section 140 and a reverse bias to be applied to the photodetecting section 120 can be supplied from power supplies of the same polarity. More specifically, for example, the second electrode 109 and the fourth electrode 116 are grounded, a forward bias to be applied to the light emitting section 140 can be supplied from a positive power supply, and a reverse bias to be applied to the photodetecting section 120 can be supplied from another positive power supply. Alternatively, for example, the second electrode 109 and the fourth electrode 116 are grounded, a forward bias to be applied to the light emitting section 140 can be supplied from a negative power supply, and a reverse bias to be applied to the photodetecting section 120 can be supplied from another negative power supply.

Also, for example, as the optical elements in the embodiments described above, a case in which the light emitting section has one columnar section is described. However, the embodiments of the present invention are not harmed even when a plurality of columnar sections are provided in a light emitting section.

Also, for example, in the optical element array in the embodiments described above, a case in which two optical elements are formed into an array is described. However, even when three or more optical elements are formed into an array, similar actions and effects can be obtained. For example, FIG. 18–FIG. 21 show cases in which four optical elements 200 are formed into an array. FIG. 18–FIG. 21 are plan views schematically showing optical element arrays 800, 810, 820 and 830 in the cases described above, respectively. It is noted that FIG. 18–FIG. 21 each show first columnar sections 130, second columnar sections 132, first mirrors 102, first electrodes 107, and element isolation sections 20, and omit illustrations of other members.

Figure 18:
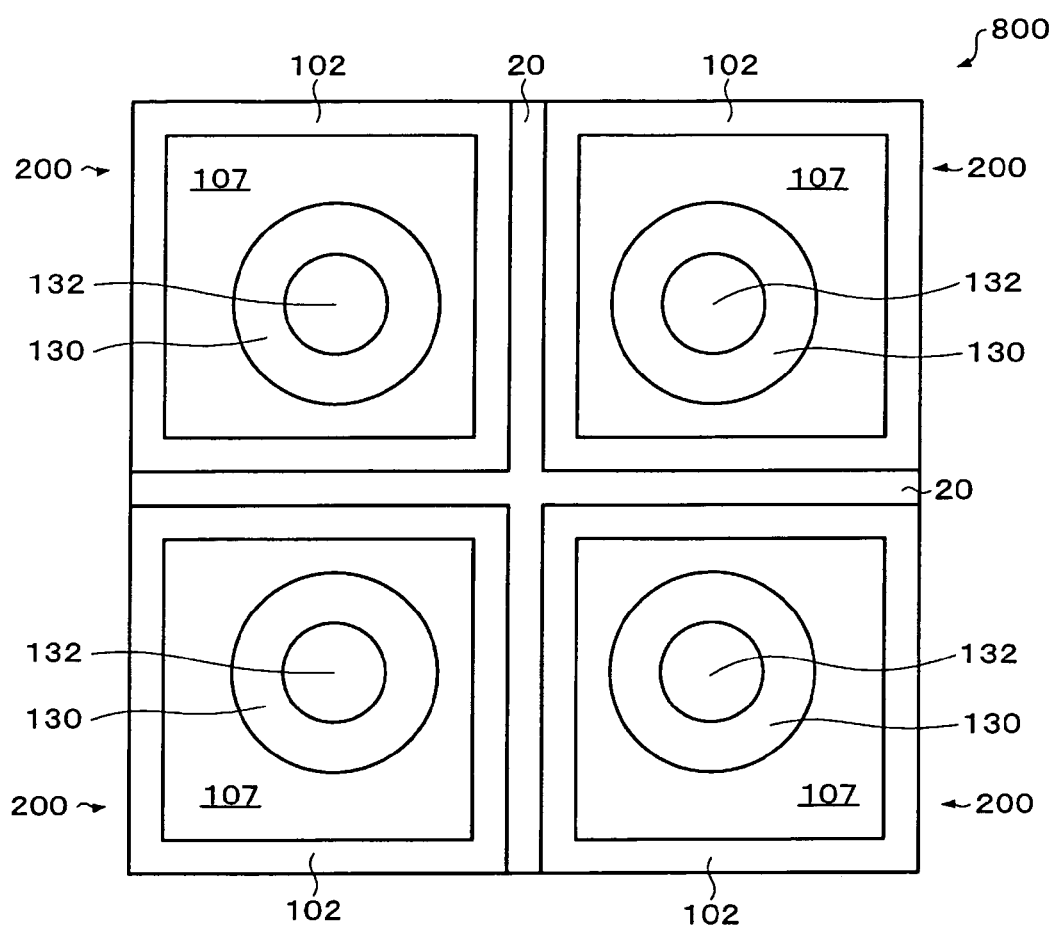
FIG. 18 is a cross-sectional view schematically showing an optical element array in accordance with an embodiment.

In the optical element array 800 shown in FIG. 18, four optical elements 200 are electrically isolated from one another by an element isolation section 200 having a plane configuration in a linear cross shape.

Figure 19:
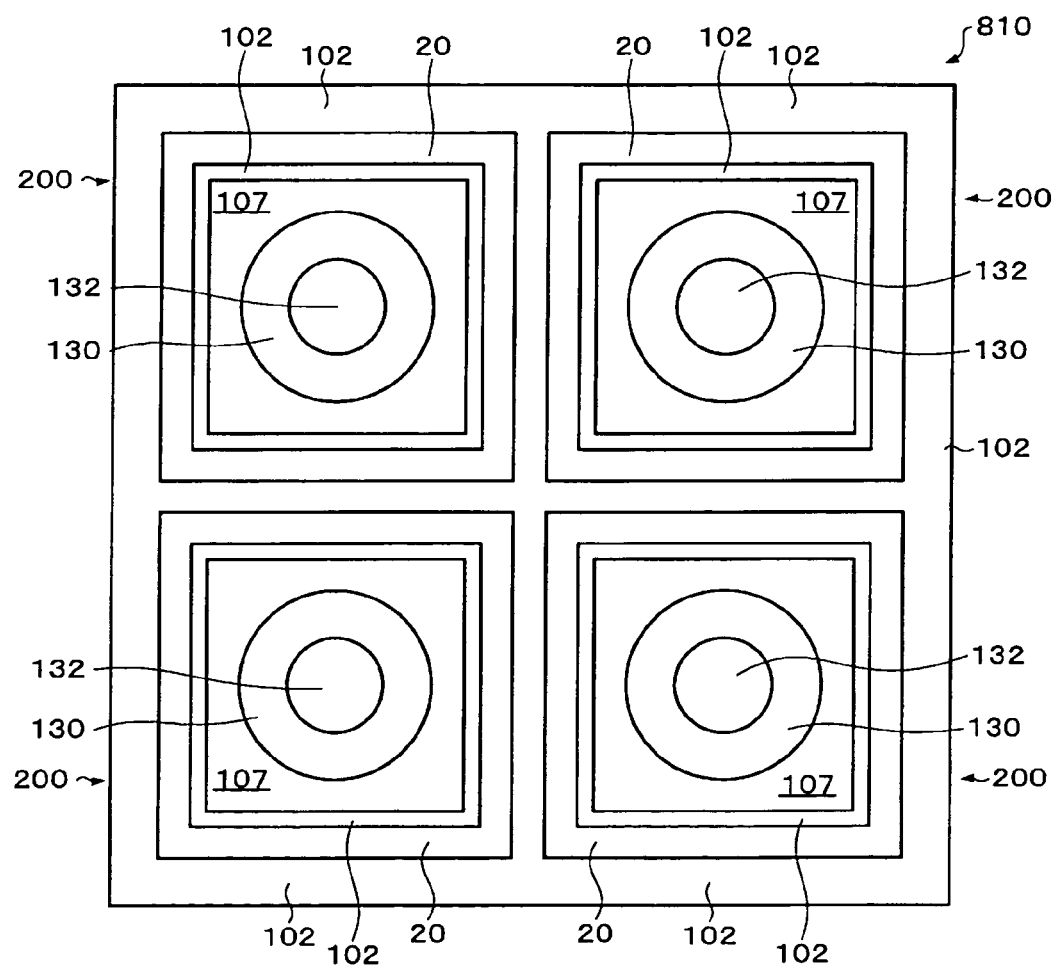
FIG. 19 is a cross-sectional view schematically showing an optical element array in accordance with an embodiment.

In the optical element array 810 shown in FIG. 19, each of optical elements 200 is surrounded by an element isolation section 20 having a plane configuration in a rectangular ring shape. Because each of the optical elements 200 is surrounded by the element isolation section 20, the four optical elements 200 are electrically isolated from one another.

Figure 20:
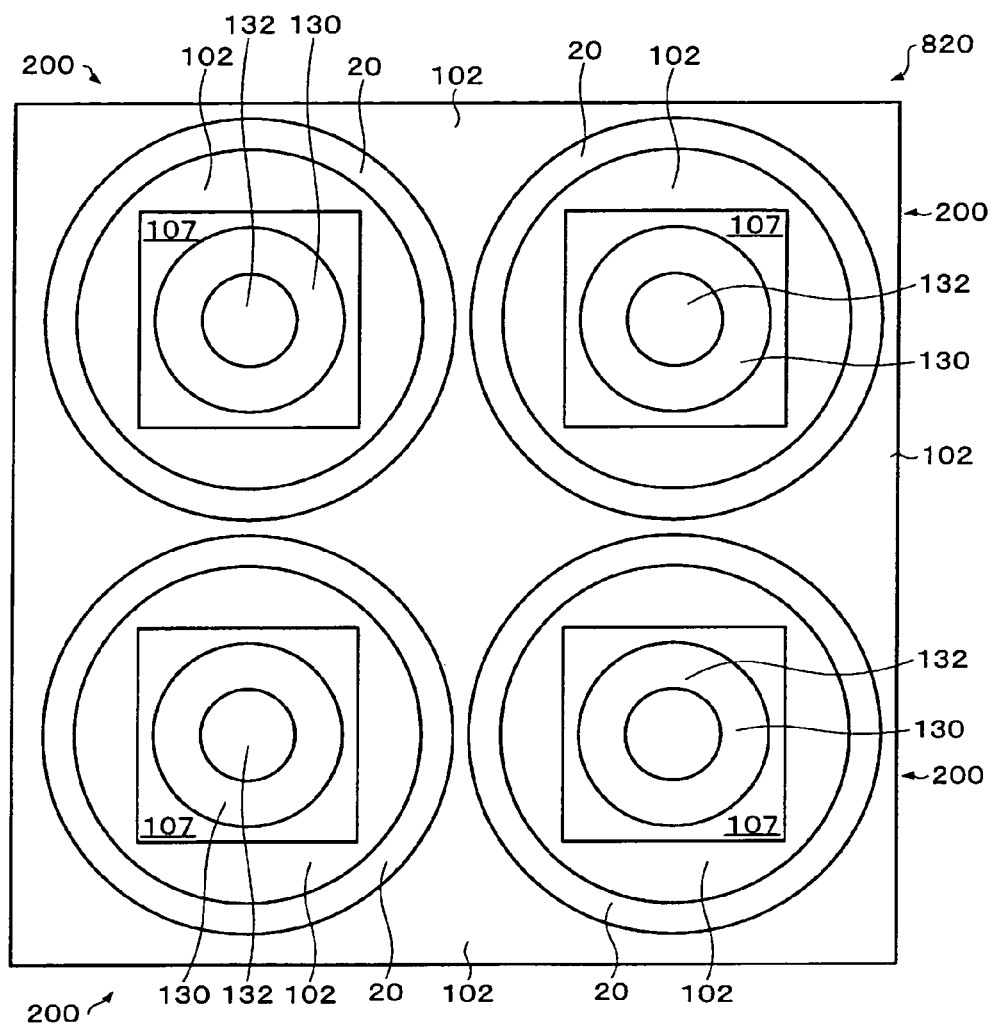
FIG. 20 is a cross-sectional view schematically showing an optical element array in accordance with an embodiment.

In the optical element array 820 shown in FIG. 20, each of optical elements 200 is surrounded by an element isolation section 20 having a plane configuration in a circular ring shape. Because each of the optical elements 200 is surrounded by the element isolation section 20, the four optical elements 200 are electrically isolated from one another.

Figure 21:
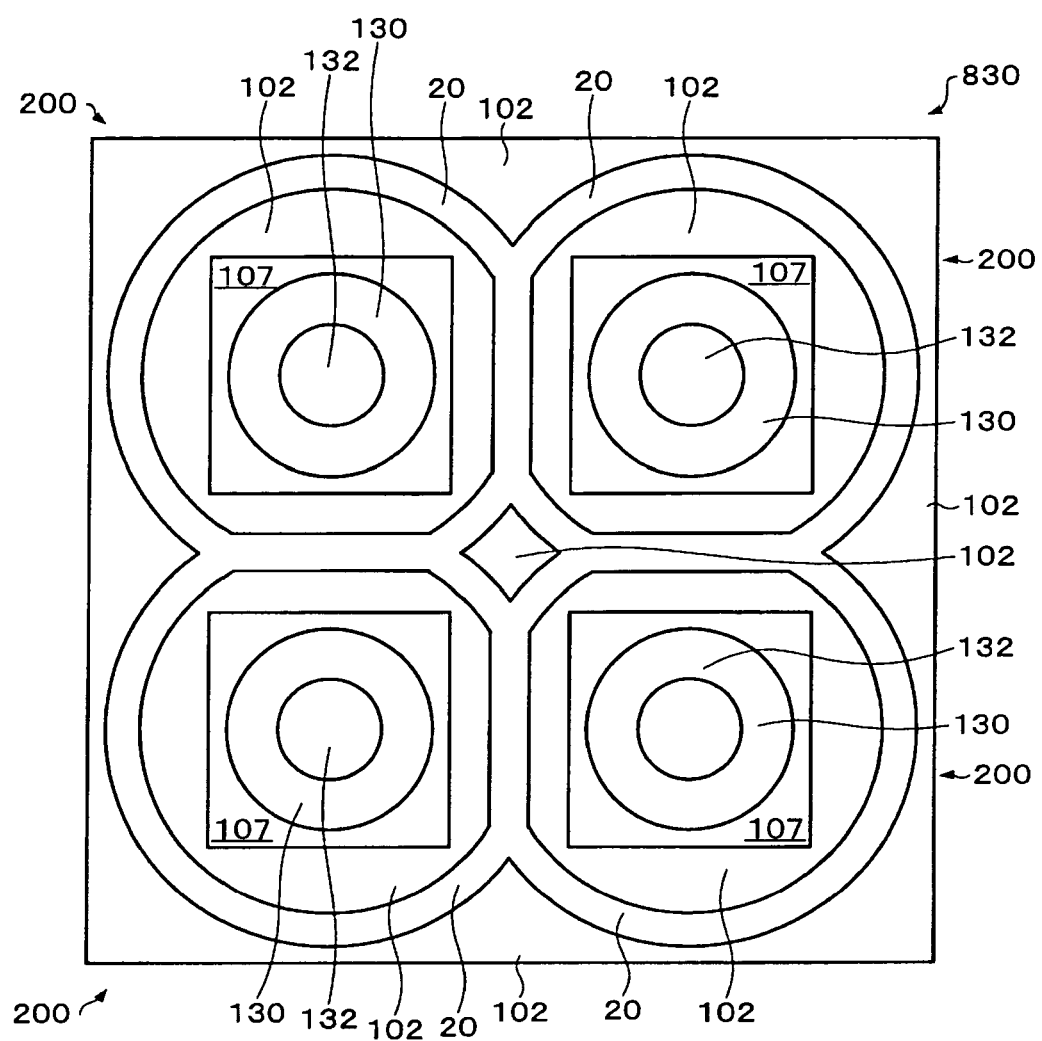
FIG. 21 is a cross-sectional view schematically showing an optical element array in accordance with an embodiment.

In the optical element array 830 shown in FIG. 21, each of optical elements 200 is surrounded by an element isolation section 20. The element isolation section 20 has a plane configuration in which portions of circular rings are in linear shapes. The linear shaped portions of the element isolation sections 20 in the plane configuration are shared by adjacent ones of the optical elements 200 as element isolation sections 20, respectively. Because each of the optical elements 200 is surrounded by the element isolation section 20, the four optical elements 200 are electrically isolated from one another.

It is noted that the plane configuration of the element isolation section 20 may be in any shape as long as it can electrically isolate the optical elements 200 from one another, and is not limited to the plane configurations described above.

Also, for example, in the above described embodiments, the description is made as to an AlGaAs type, but depending on the oscillation wavelength, other materials, such as, for example, GaInP type, ZnSSe type, InGaN type, AlGaN type, InGaAs type, GaInNAs type, GaAsSb type, and like semiconductor materials can be used.

What is claimed is:

1. A optical element array comprising:
a plurality of optical elements having a substrate, light emitting sections formed above the substrate and photodetecting sections formed above the light emitting sections; and
an element isolation section that is formed between the optical elements, for electrically isolating the optical elements from one another,
wherein the substrate is dielectric or semi-dielectric,
the light emitting section includes a first semiconductor layer, an active layer, and a second semiconductor layer,
the photodetecting section includes a first contact layer, a photoabsorption layer, and a second contact layer,
the optical element has a first electrode that is electrically connected to the first semiconductor layer, a second electrode that is electrically connected to the second semiconductor layer, and a third electrode that is electrically connected to the first contact layer
the first electrodes are electrically isolated from one another between the optical elements, and
the second electrodes define a common electrode for driving the light emitting section and the photodetecting section.

2. A optical element array according to claim 1, wherein the element isolation section is a groove.

3. A optical element array according to claim 2, wherein the groove is embedded with dielectric resin.

4. A optical element array according to claim 1, wherein the element isolation section is an impurity layer formed by ion injection.

5. A optical element array according to claim 1, wherein the optical element has a fourth electrode that is electrically connected to the second contact layer.

6. A optical element array according to claim 1, wherein the first contact layer concurrently defines an uppermost layer of the second semiconductor layer, and the second electrode is formed to be in contact with the first contact layer.

7. A optical element array according to claim 1, wherein the third electrode is electrically connected to the second electrode.

8. A optical element array according to claim 1, wherein the light emitting section functions as a light emitting diode,
the first semiconductor layer is a first conductive type, and the second semiconductor layer is a second conductive type.

9. A optical element array according to claim 1, wherein the light emitting section functions as a surface-emitting type semiconductor laser,
the first semiconductor layer is a first mirror, and the second semiconductor layer is a second mirror.

10. A optical element array according to claim 1, wherein the optical element has an optical member that functions as a lens above the photodetecting section.

11. An optical module comprising the optical element array according to claim 1, and an optical waveguide.

12. An optical transmission device comprising the optical module according to claim 11.

* * * * *